US012613278B2

(12) United States Patent
Li et al.

(10) Patent No.: US 12,613,278 B2
(45) Date of Patent: *Apr. 28, 2026

(54) SCAN FLIP-FLOPS WITH PRE-SETTING COMBINATIONAL LOGIC

(71) Applicant: Taiwan Semiconductor Manufacturing Company, Ltd., Hsinchu (TW)

(72) Inventors: Johnny Chiahao Li, Hsinchu (TW); Sheng-Hsiung Chen, Hsinchu (TW); Tzu-Ying Lin, Hsinchu (TW); Yung-Chen Chien, Kaohsiung (TW); Jerry Chang Jui Kao, Taipei (TW); Xiangdong Chen, San Diego, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/770,809

(22) Filed: Jul. 12, 2024

(65) Prior Publication Data

US 2024/0361383 A1     Oct. 31, 2024

Related U.S. Application Data

(63) Continuation of application No. 18/150,830, filed on Jan. 6, 2023, now Pat. No. 12,066,489.

(Continued)

(51) Int. Cl.
G01R 31/3185     (2006.01)
(52) U.S. Cl.
CPC ............... G01R 31/318536 (2013.01); G01R 31/318525 (2013.01); G01R 31/318541 (2013.01); G01R 31/318555 (2013.01)

(58) Field of Classification Search
CPC .... G01R 31/318536; G01R 31/318525; G01R 31/318541; G01R 31/318555
(Continued)

(56) References Cited

U.S. PATENT DOCUMENTS 7,437,634 B2 * 10/2008 Jaber .............. G01R 31/318552
                                              327/202
9,529,044 B1 * 12/2016 Taneja ........... G01R 31/318547
(Continued)

FOREIGN PATENT DOCUMENTS

TW          200500896 A     1/2005
TW          200925919 A     6/2009
(Continued)

OTHER PUBLICATIONS

Taiwan office action; Application No. 112107992; Dated Nov. 8, 2023.
(Continued)

*Primary Examiner* — John J Tabone, Jr.
(74) *Attorney, Agent, or Firm* — Jones Day

(57)     ABSTRACT

Systems, methods, and devices are described herein for pre-setting scan flip-flops using combinational logic circuits. A system includes a plurality of flip-flop devices and a first pre-setting combinational logic circuit. The plurality of flip-flop devices are coupled together in series and configured to receive a scan input signal, capture data output from each flip-flop device of the plurality of flip-flop devices based on the scan input signal, and generate a scan output signal comprising the captured data. The first pre-setting combinational logic circuit is coupled to a first flip-flop device of the plurality of flip-flop devices. The first pre-setting combinational logic circuit includes a plurality of transistors and is configured to override and set either the scan input signal to the first flip-flop device or the scan (Continued)

output signal of the first flip-flop device based on selective operation of the plurality of transistors.

20 Claims, 29 Drawing Sheets

Related U.S. Application Data

(60) Provisional application No. 63/403,324, filed on Sep. 2, 2022.

(58) Field of Classification Search
USPC ................................................ 714/726, 729
See application file for complete search history.

(56) References Cited

U.S. PATENT DOCUMENTS

| | | | | | |
|---|---|---|---|---|---|
| 12,066,489 | B2 * | 8/2024 | Li | ................... | G01R 31/318555 |
| 2003/0229834 | A1 * | 12/2003 | Cooke | ............ | G01R 31/318385 |
| | | | | | 714/726 |
| 2014/0289578 | A1 * | 9/2014 | Sugiyama | ...... | G01R 31/318533 |
| | | | | | 714/727 |
| 2024/0077534 | A1 * | 3/2024 | Li | ................... | G01R 31/318555 |
| 2024/0361383 | A1 * | 10/2024 | Li | ................... | G01R 31/318555 |

FOREIGN PATENT DOCUMENTS

| | | |
|---|---|---|
| TW | 201009368 A | 3/2010 |
| TW | 201830868 A | 8/2018 |
| TW | I684987 B | 2/2020 |
| TW | 202016561 A | 5/2020 |
| TW | 202143646 A | 11/2021 |
| TW | 202230131 A | 8/2022 |

OTHER PUBLICATIONS

Hu et al.; Pre-Settable Adiabatic Flip-Flops and Sequential Circuits; IEEE; pp. 2299-2303; 2006.
Kim et al.; Presetting Pulse-based Flip-Flop; IEEE; pp. 588-591; 2008.

* cited by examiner

300

350

450

Pre-set flip-flop chain to (1,1,1,1)    ~ 452

Allow clock to toggle and output to be captured    ~ 454

Scan-out captured results and compared with expected pattern    ~ 456

| Mode | A | B | SI | SO |
|---|---|---|---|---|
| SI Default | 1 | 0 | sl_a | sl_a |
| Set H | 0 | 1 | 0 or 1 | 1 |
| Set L | 0 | 0 | 0 or 1 | 0 |

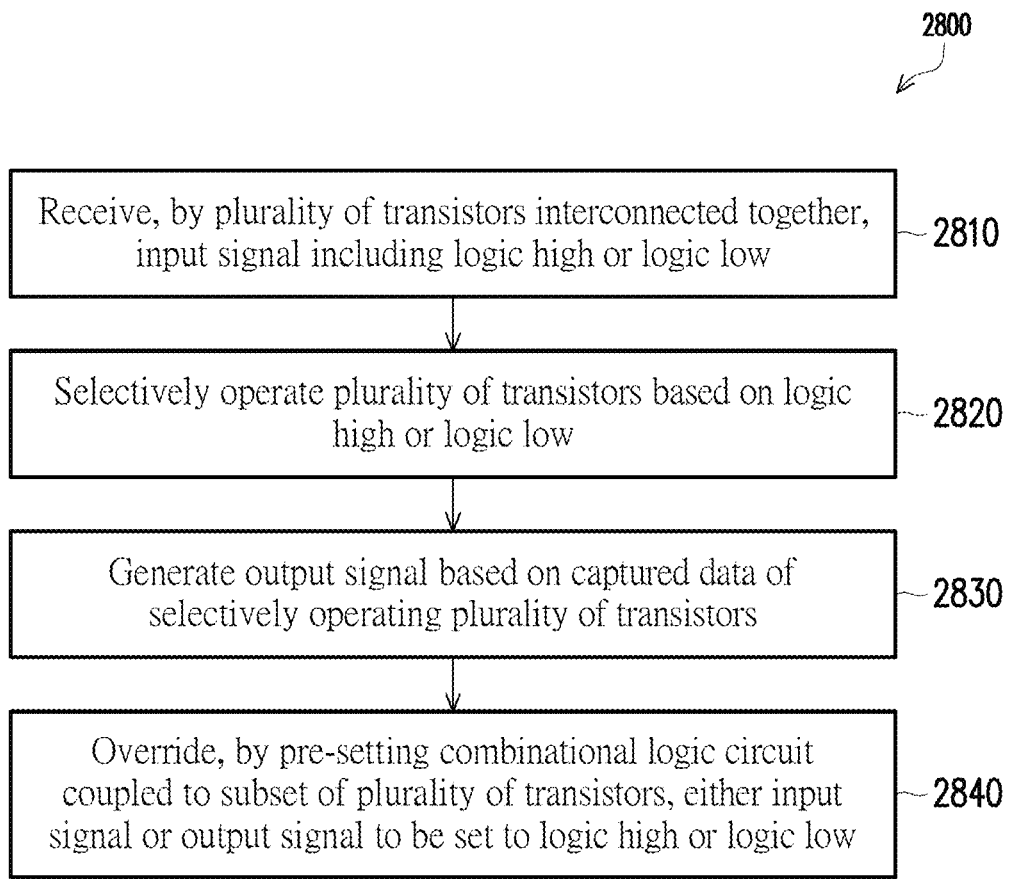

2800

Receive, by plurality of transistors interconnected together, input signal including logic high or logic low ~ 2810

Selectively operate plurality of transistors based on logic high or logic low --- 2820

Generate output signal based on captured data of selectively operating plurality of transistors ~ 2830

Override, by pre-setting combinational logic circuit coupled to subset of plurality of transistors, either input signal or output signal to be set to logic high or logic low ~ 2840

FIG. 28

SCAN FLIP-FLOPS WITH PRE-SETTING COMBINATIONAL LOGIC

CROSS-REFERENCE TO RELATED APPLICATIONS

This application is a continuation application of U.S. patent application Ser. No. 18/150,830, filed Jan. 6, 2023, which claims priority from U.S. Provisional Application No. 63/403,324, filed Sep. 2, 2022, the contents of each of which are incorporated herein by reference in their entirety.

BACKGROUND

Most electronics today rely upon semiconductor devices or chips to operate. Semiconductor chips can often be made up of a number of integrated circuits (IC). In order for electronics to function properly, the ICs have to function properly. Functionality testing is performed on ICs to ensure they operate as designed.

BRIEF DESCRIPTION OF THE DRAWINGS

Aspects of the present disclosure are best understood from the following detailed description when read with the accompanying figures:

FIG. 28 is a process flow diagram illustrating method of generating a pre-defined input or output for a scan flip-flop chain in accordance with various embodiments of the present disclosure.

DETAILED DESCRIPTION

Figure 1:
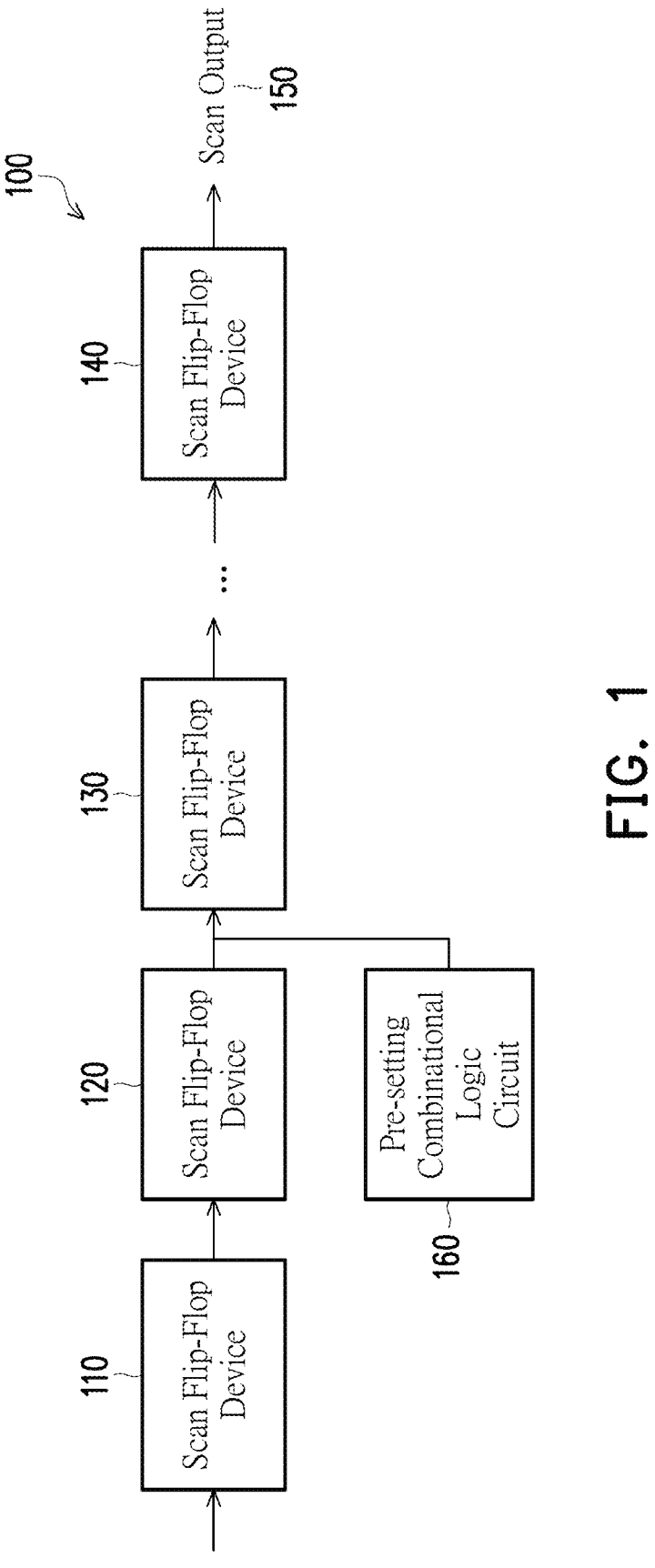
FIG. 1 is a block diagram illustrating a scan chain in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Testing the functionality of a manufactured product can help ensure products are defect free. Design for testing (DFT) is a technique utilized in testing functionality of a hardware product design containing integrated circuits (IC). In silicon-on-chip (SOC) designs, flip-flop circuits such as D-type flip-flops (DFFs) or scan DFFs (SDFFs or scan flip-flops) can be used to perform DFT. The scan flip-flops can verify functionality of components or cells within an IC.

Components of the scan flip-flops, however, can also malfunction and lead to inaccurate DFT results. The subject matter described herein utilizes a pre-setting combinational logic circuit to identify a malfunctioning scan flip-flop within a scan chain.

FIG. 1 is a block diagram illustrating a scan chain 100 in accordance with various embodiments of the present disclosure. Scan chain 100 includes a number of interconnected scan flip-flops 110, 120, 130, 140. If any scan flip-flop in the scan chain 100 fails (e.g., outputs corrupted data), the subsequent scan flip-flops in the scan chain will also have corrupted scan data. This in turn causes the scan output 150 for the scan chain 100 to be corrupted. For example, if scan flip-flop 120 malfunctions and outputs corrupted data, scan flip-flop 130 and scan flip-flop 140 (along with the other scan flip-flops therebetween which are not illustrated in FIG. 1) will also have corrupted output as its input (e.g., corrupted data out from scan flip-flop 120) is corrupted. This corrupted scan data leads to a scan failure. It is the corrupted scan output 150 that indicates such a scan failure occurred.

Based on the scan output 150 alone, however, there may not be an indication of which particular scan flip-flop in the scan chain 100 malfunctioned. Use of a pre-setting combinational logic circuit 160 can assist in identifying that scan flip-flop. Pre-setting combination logic circuit 160 can be interconnected into scan chain 100 and can pre-set each scan flip-flop to a specific known value (e.g., either a logic high '1' or a logic low '0'). For example, with each of scan flip-flop devices 110-140 preset to output a logic high '1', an expected output stream for scan output 150 is '111 . . . 1'. After a clock cycle (e.g., clock toggles) if the scan output 150 is '101 . . . 1' instead of the expected '111 . . . 1', the second data bit in the data stream being a logic low '0' indicates that the scan flip-flop 120 is malfunctioning as it did not output the pre-set logic high '1'. By pre-setting each scan flip-flop to a known value, any malfunctioning scan flip-flop within the scan chain 100 can be identified. For the purpose of illustration and ease of understanding, scan chain 100 includes one pre-setting combinational logic circuit 160. However, one of ordinary skill in the art can appreciate that any number of pre-setting combinational logic circuits as described in more detail in FIGS. 4-5 and 19-26.

Figure 2A:
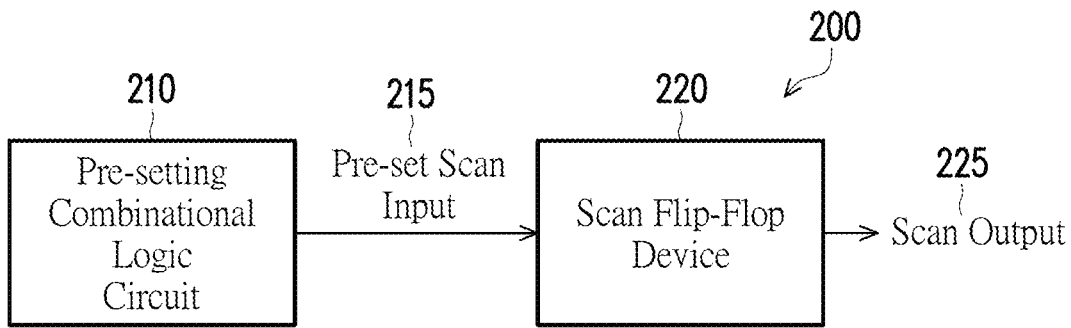
FIG. 2A is a block diagram illustrating an example pre-set arrangement in accordance with various embodiments of the present disclosure.

FIG. 2A is a block diagram illustrating an example pre-set arrangement 200 in accordance with various embodiments of the present disclosure. In pre-set arrangement 200, the pre-setting of flip-flop 220 occurs on the front end. The pre-setting combinational logic circuit 210 is coupled to the scan flip-flop 220 such that pre-setting combinational logic circuit 210 generates a pre-set input 215 for scan flip-flop 220. Based on the pre-set input 215, scan flip-flop 220 outputs scan output 225. If scan flip-flop 220 is functioning properly, the scan output 225 will equal the pre-set input 215. If scan flip-flop 220 is malfunctioning, however, the scan output 225 will not equal the pre-set input 215.

Figure 2B:
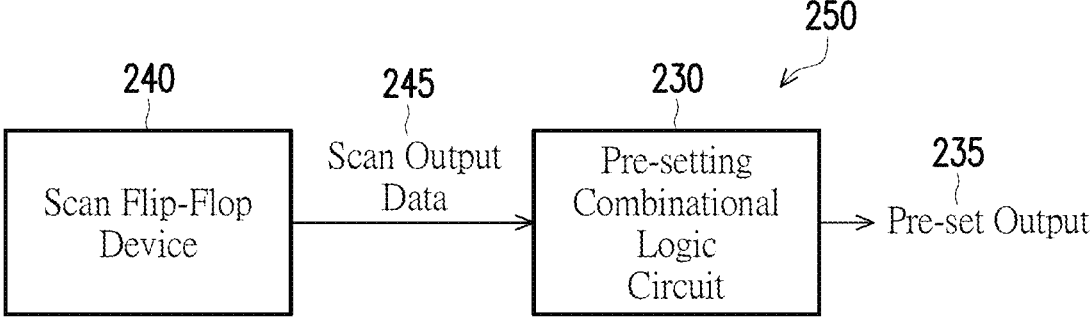
FIG. 2B is a block diagram illustrating another example pre-set arrangement in accordance with various embodiments of the present disclosure.

FIG. 2B is a block diagram illustrating another example pre-set arrangement 250 in accordance with various embodiments of the present disclosure. Pre-set arrangement 250 differs from pre-set arrangement 200 in that the pre-setting of flip-flop 220 occurs on the back end. The pre-setting combinational logic circuit 230 is coupled to the scan flip-flop 240 such that scan flip-flop 240 generates scan output 245 that is provided to pre-setting combinational logic circuit 230 as input. The pre-setting combinational logic circuit 230 outputs a pre-set output 235 based on the scan output 245. If scan flip-flop 240 is functioning properly, the pre-set output 235 will equal the known value. If scan flip-flop 240 is malfunctioning, however, the pre-set output 235 will not equal the known value.

Figure 3A:
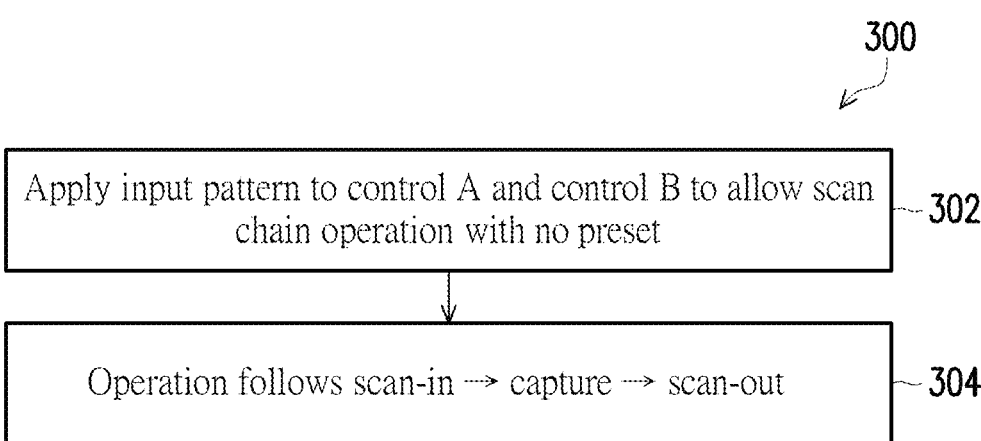
FIG. 3A is a process flow diagram illustrating steps of a standard scan chain operational mode in accordance with various embodiments of the present disclosure.
Figure 3B:
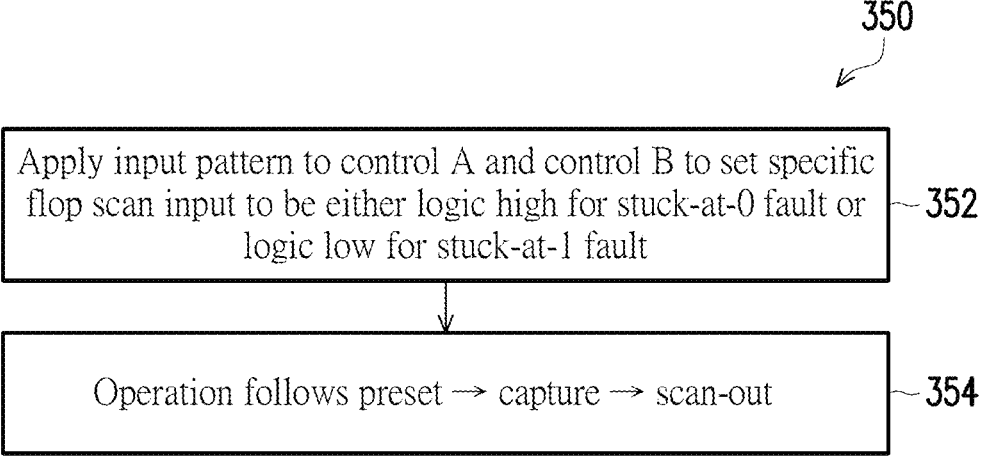
FIG. 3B is a process flow diagram illustrating steps of a pre-defined operational mode in accordance with various embodiments of the present disclosure.

Scan chain 100 can have two operational modes: a standard scan chain operational mode and a pre-defined operational mode. FIG. 3A is a process flow diagram 300 illustrating steps of a standard scan chain operational mode in accordance with various embodiments of the present disclosure. At step 302, control signal input patterns (e.g., control A and control B) are provided to the scan chain 100 to allow a standard scan chain operation with no preset. In this standard scan chain operational mode, at step 304, the operations of scan chain 100 follows a scan-in phase, capture phase, and scan-out phase. FIG. 3B is a process flow diagram 350 illustrating steps of a pre-defined operational mode in accordance with various embodiments of the present disclosure. At step 352, control signal input patterns (e.g., control A and control B) are provided to the scan chain 100 to set specific flop scan input as either a high for stuck-at-0 fault or low for stuck-at-1 fault. In the pre-defined operational model, at step 354, the operations of scan chain 100 follows a pre-set phase, a capture phase, and a scan-out phase.

Figure 4A:
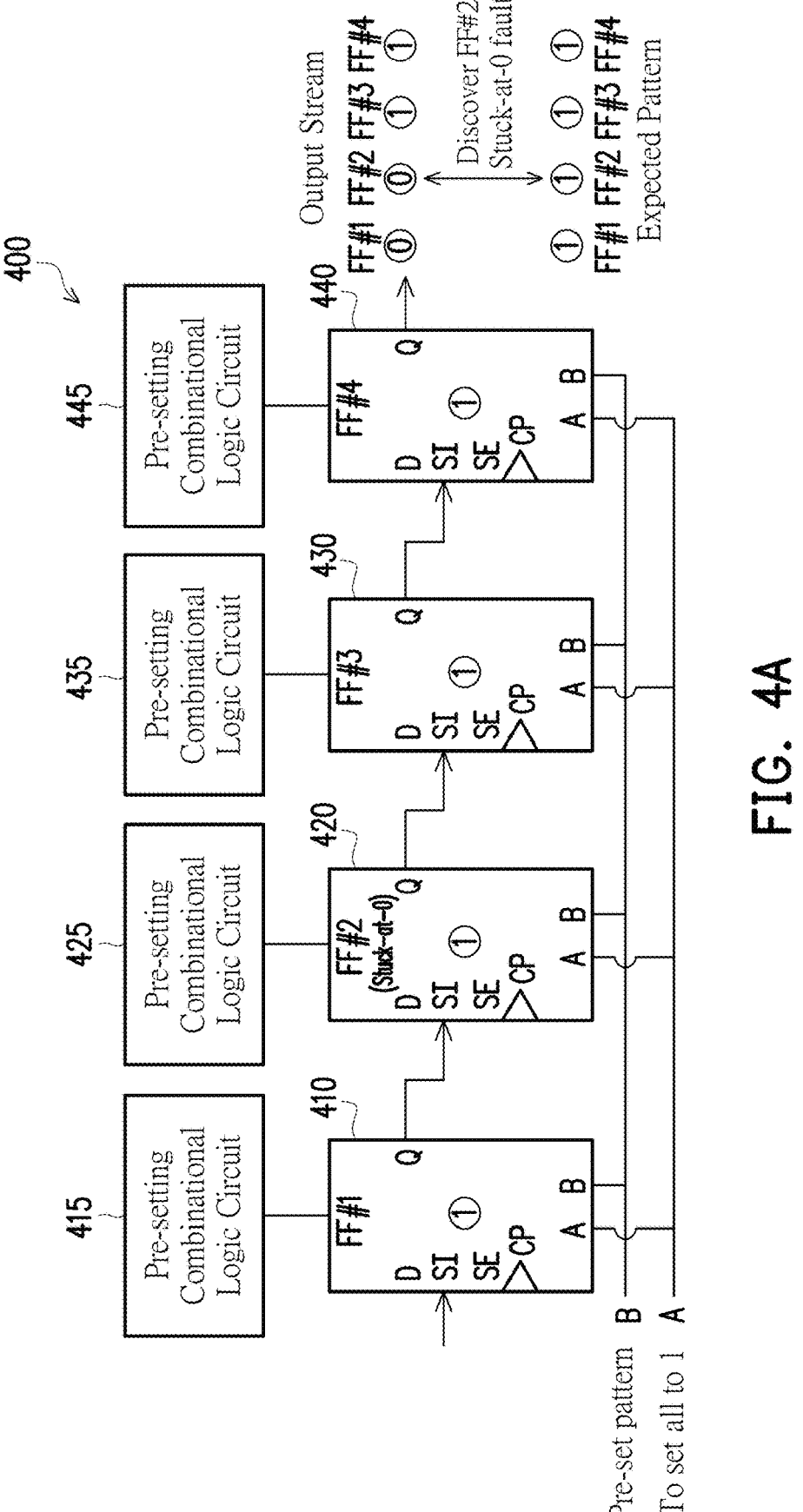
FIG. 4A is a block diagram illustrating an example scan chain in accordance with various embodiments of the present disclosure.

FIG. 4A is a block diagram illustrating an example scan chain 400 in accordance with various embodiments of the present disclosure. Scan chain 400 includes a plurality of scan flip-flops 410, 420, 430, 440. Each scan flip-flop can have an associated pre-setting combinational logic circuit 415, 425, 435, 445. In a testing mode, scan chain 400 initiates operations in the standard scan chain operation modes. If during the scan chain operation mode, the scan chain fails due to, for example, a faulty flip-flop the scan chain 400 can enter the pre-defined operational mode for debugging. In the pre-defined operational mode, one or more of the faulty flip-flops can be identified as described in detail below.

Figure 4B:
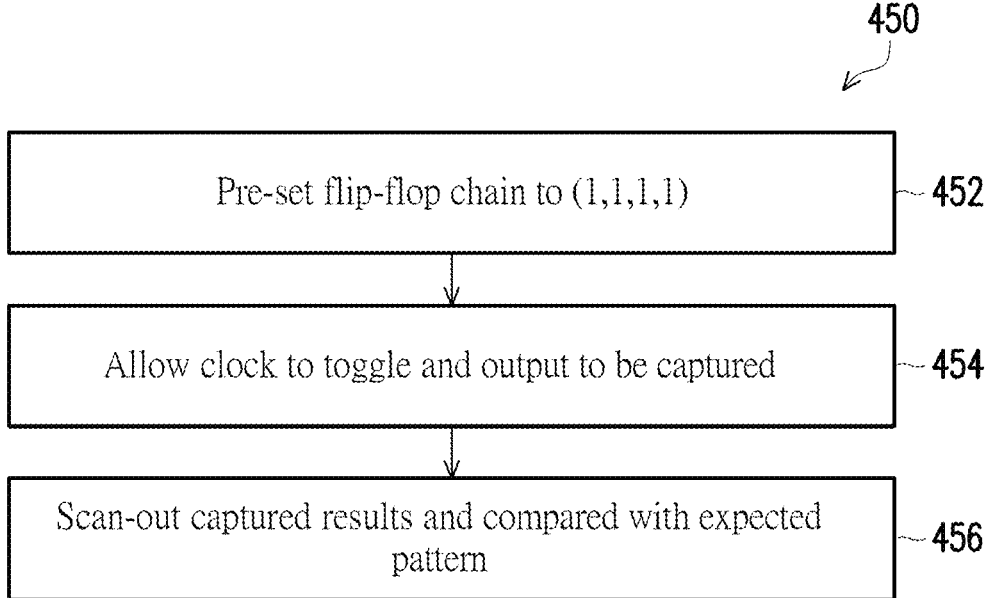
FIG. 4B is a process flow diagram illustrating a testing method of the scan chain in accordance with various embodiments of the present disclosure.

FIG. 4B is a process flow diagram 450 illustrating a testing method of the scan chain 400 in accordance with various embodiments of the present disclosure. At step 452, the scan chain 400 is pre-set to a testing pattern of (1, 1, 1, 1) using pre-set control signals (e.g., control A, control B). For example, each flip-flops is expected to output a logic high in the corresponding bit location of the flip-flop. At step 454, the clock is allowed to toggle and output of the scan chain 400 is captured. At step 456, the captured results are scanned out of the scan chain 400 and compared with the expected pattern (e.g., 1, 1, 1, 1). By way of example in FIG. 4A, the scan out pattern is (0, 0, 1, 1), confirming that the there is a stuck-at-0 fault at flip-flop 420. Flip-flop 420 being faulty can be identified using the pre-setting combination logic circuits described herein.

Figure 5A:
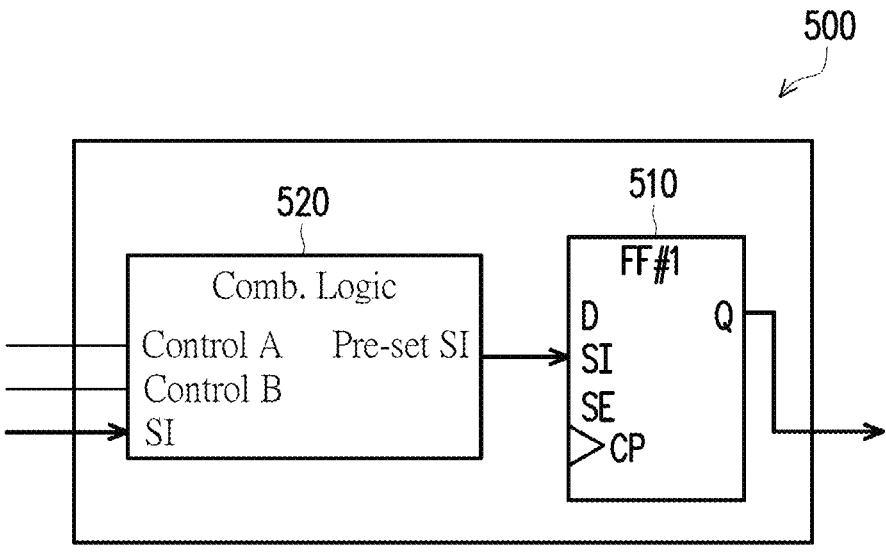
FIG. 5A is a block diagram illustrating an example pre-set arrangement with various input and output signals in accordance with various embodiments of the present disclosure.

FIG. 5A is a block diagram illustrating an example pre-set arrangement 500 (e.g., pre-set arrangement 200) with various input and output signals in accordance with various embodiments of the present disclosure. Scan flip-flop 510 includes input pins for data (D), a scan enable (SE) signal, a scan input (SI) signal, and a clock signal (CP) and an output (Q) signal. The output (Q) signal is either the data (D) or scan input (SI) signal based on the scan enable (SE) signal. Additionally, the scan enable (SE) input controls the IC in a shift test mode or a capture test mode. In the shift test mode, the plurality of scan flip-flops in each scan chain forms a chain of serial shift registers. Test pattern data is serially shifted into the scan chain through the scan input at a pace controlled by the scan clock input. At the same time, data in the scan chain is shifted out of and observed at the scan output. In the capture test mode, the scan flip-flops in each scan chain assumes their respective role in functional mode (non-test mode). When one or more clock signals are applied at the scan clock input, the scan flip-flops captures results of the test. A subsequent shift operation shifts the results out of the scan output and compares the results with predetermined targets to detect whether faults are present in the IC. Pre-setting combinational logic circuit 520 receives control signals (e.g., control A and control B) as well as a scan input (SI) signal and generates and outputs the pre-set scan input signal. The pre-set scan input signal generated by the pre-setting combinational logic circuit 520 is provided to the scan flip-flop 510 at the scan input (SI) pin.

Figure 5B:
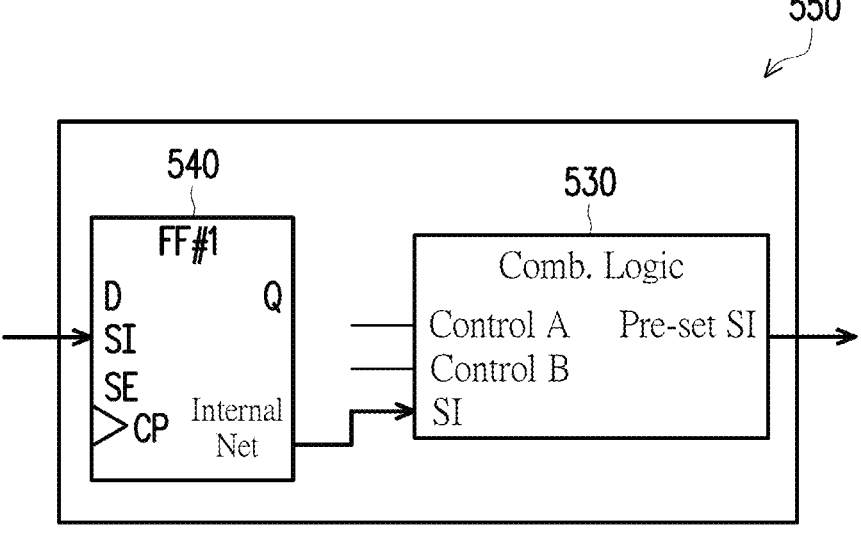
FIG. 5B is a block diagram illustrating another example pre-set arrangement with various input and output signals in accordance with various embodiments of the present disclosure.

FIG. 5B is a block diagram illustrating another example pre-set arrangement 550 (e.g., pre-set arrangement 250) with various input and output signals in accordance with various embodiments of the present disclosure. Scan flip-flop 540 has the same input and output pins as scan flip-flop 510 described in FIG. 5A. Similarly, pre-setting combinational logic circuit 530 has the same input and output pins as pre-setting combinational logic circuit 520 described in FIG. 5A. In the pre-set arrangement 550, scan flip-flop 540 has one additional output pin for outputting an internal signal to the scan input (SI) pin of the pre-setting combinational logic circuit 530.

Figure 6:
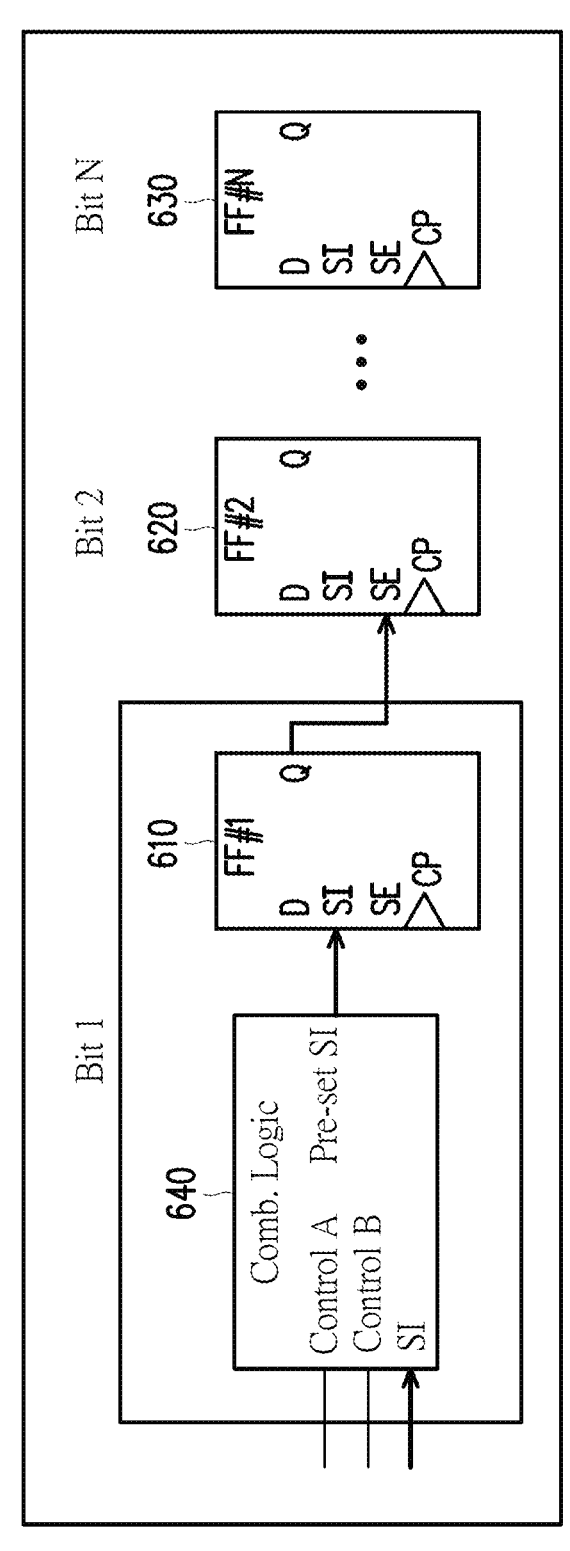
FIG. 6 is a block diagram illustrating a N multi-bit flop scan chain having a pre-settable first bit in accordance with various embodiments of the present disclosure.

Pre-set combinational logic circuits can be used in various locations within a scan chain. For example, FIG. 6 is a block diagram illustrating a N multi-bit flop scan chain 600 having a pre-settable first bit in accordance with various embodiments of the present disclosure. Multi-bit flop scan chain 600 includes N number of scan flip-flops (e.g., scan flip-flops 610-630). Each flip-flop corresponds to a bit. For example, scan flip-flop 610 corresponds to bit 1, scan flip-flop 620 corresponds to bit 2, and scan flip-flop 630 corresponds to bit N. The first bit (e.g., bit 1) scan flip-flop 610 is pre-settable as it receives its scan input (SI) signal from the pre-settable combinational logic circuit 640. Although pre-setting combinational logic circuit 640 is illustrated in FIG. 6 on the front end of scan flip-flop 610 for the purpose of illustration and ease of understanding, pre-setting combinational logic circuit 640 can also be on the back end of scan flip-flop 610.

Figure 7:
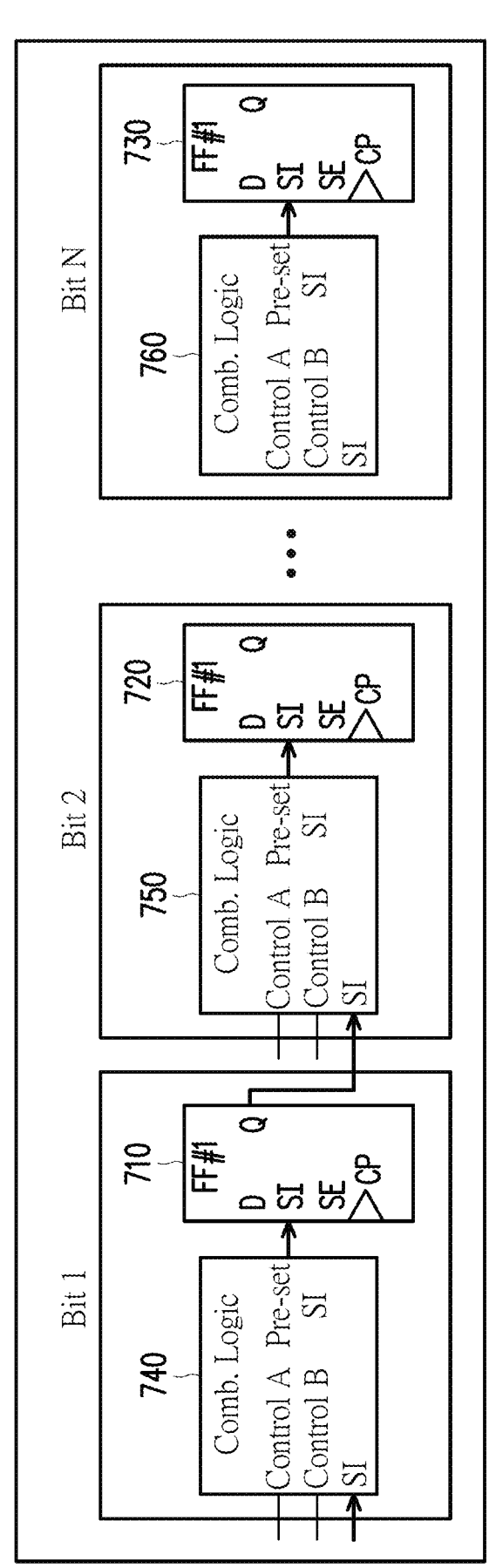
FIG. 7 is a block diagram illustrating a N multi-bit flop scan chain having all bits pre-settable in accordance with various embodiments of the present disclosure.

In another example, FIG. 7 is a block diagram illustrating a N multi-bit flop scan chain 700 having all bits pre-settable in accordance with various embodiments of the present disclosure. Multi-bit flop scan chain 700 includes N number of scan flip-flops (e.g., scan flip-flops 710-730). Each flip-flop corresponds to a bit, as previously described in FIG. 6, and has a pre-setting combinational logic circuit coupled thereto. More specifically, the first bit (e.g., bit 1) scan flip-flop 710 is pre-settable as it receives its scan input (SI) signal from the pre-settable combinational logic circuit 740. The second bit (e.g., bit 2) scan flip-flop 720 is pre-settable as it receives its scan input (SI) signal from the pre-settable combinational logic circuit 750. The N bit scan flip-flop 730 is pre-settable as it receives its scan input (SI) signal from the pre-settable combinational logic circuit 760. Although pre-setting combinational logic circuits 740-760 is illustrated in FIG. 7 on the front end of scan flip-flops 710-720 for the purpose of illustration and ease of understanding, pre-setting combinational logic circuits 740-760 can also be on the back end of scan flip-flops 710-720.

Figure 8:
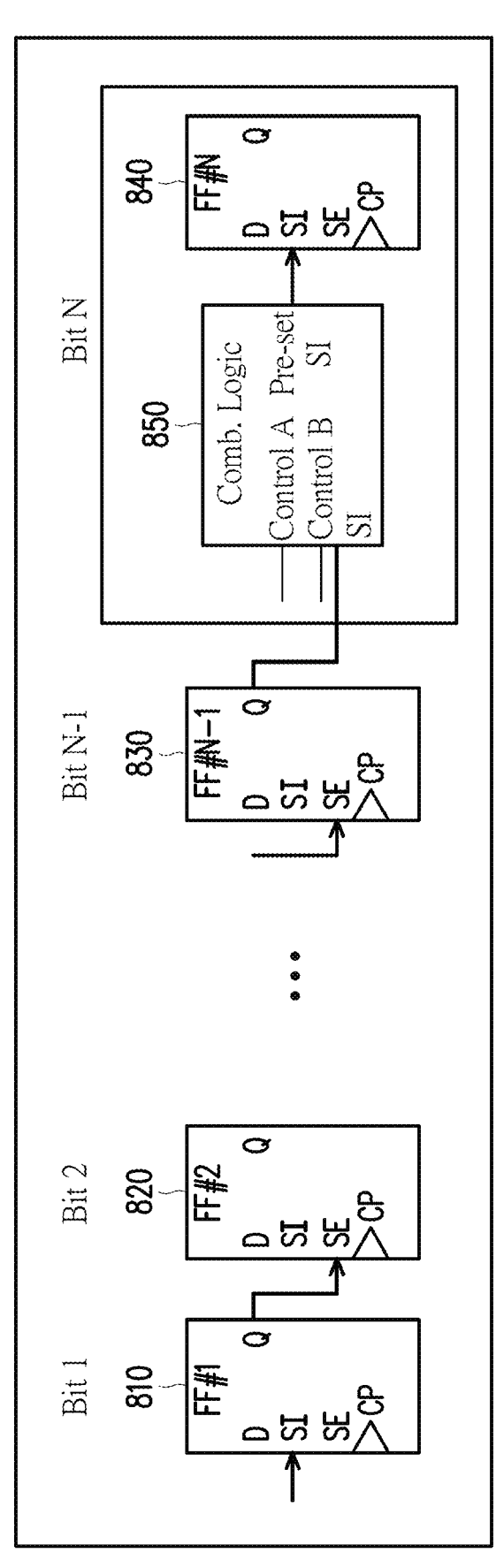
FIG. 8 is a block diagram illustrating a N multi-bit flop scan chain having a pre-settable last bit in accordance with various embodiments of the present disclosure.

In yet another example, FIG. 8 is a block diagram illustrating a N multi-bit flop scan chain 800 having a pre-settable last bit in accordance with various embodiments of the present disclosure. Multi-bit flop scan chain 800 includes N number of scan flip-flops (e.g., scan flip-flops 810-840). Each flip-flop corresponds to a bit, as previously described in FIG. 8. The last bit (e.g., bit N) is pre-settable as it receives its scan input (SI) signal from the pre-setting combinational logic circuit 850. The scan input (SI) signal of pre-setting combinational logic circuit 850 is provided by the output (Q) signal of the second to last bit (e.g., bit N–1) scan flip-flop 830. Although pre-setting combinational logic circuit 850 is illustrated in FIG. 8 on the front end of scan flip-flop 840 for the purpose of illustration and ease of understanding, pre-setting combinational logic circuit 850 can also be on the back end of scan flip-flop 840.

Figures 9A, 9B:
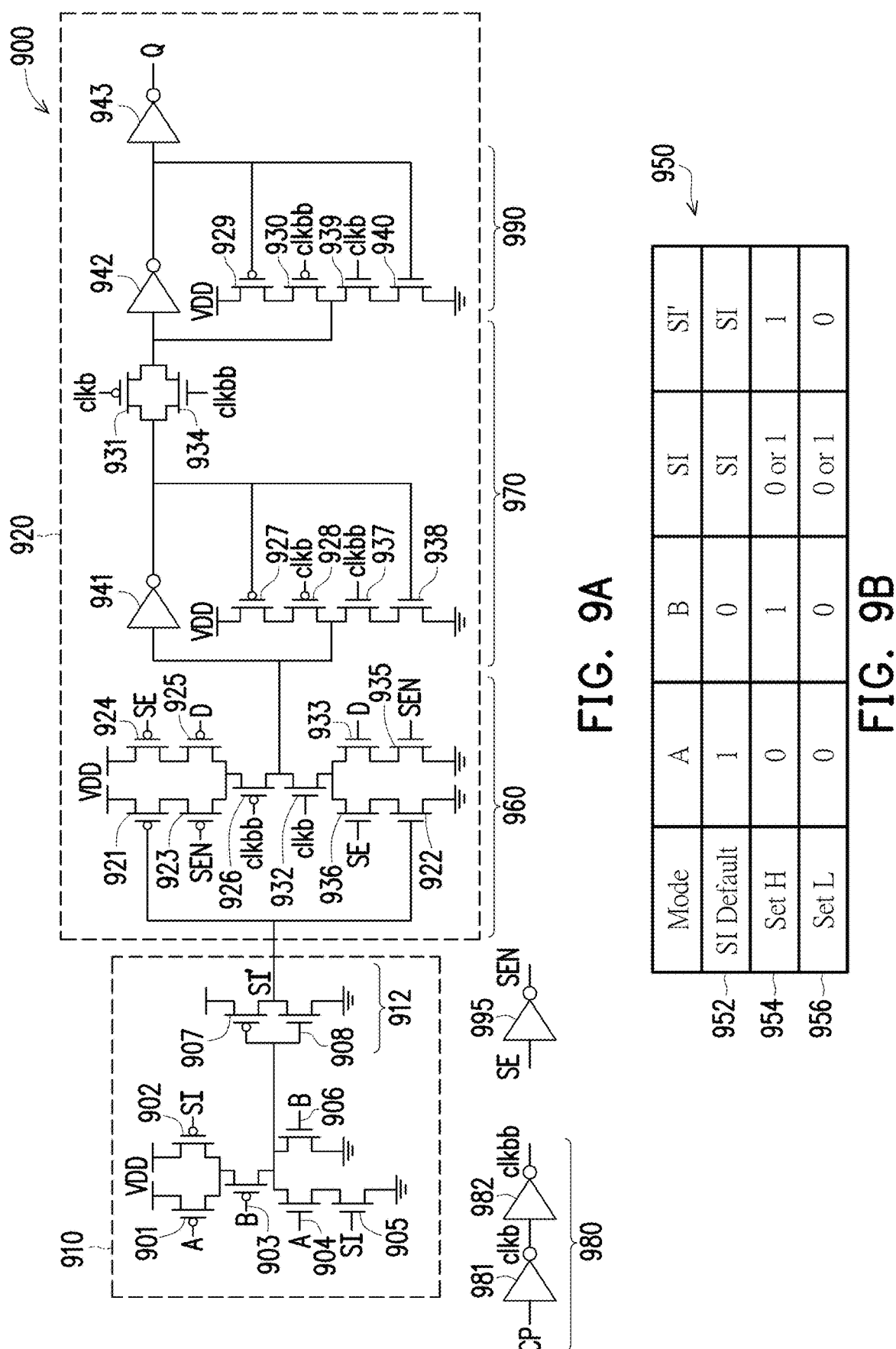
FIG. 9A is an electrical schematic illustrating an example pre-settable scan flip-flop circuit in accordance with various embodiments of the present disclosure.
FIG. 9B is a logic table illustrating various signals of pre-setting combinational logic circuit in accordance with various embodiments of the present disclosure.

FIG. 9A is an electrical schematic illustrating an example pre-settable scan flip-flop circuit 900 in accordance with various embodiments of the present disclosure. Pre-settable scan flip-flop circuit 900 includes a pre-setting combinational logic circuit 910 electrically coupled to a scan flip-flop 920. Pre-setting combinational logic circuit 910 is on the front end of the scan flip-flop 920 (e.g., pre-set arrangement 200).

Pre-setting combinational logic circuit 910 includes a plurality of P-type metal oxide semiconductor (PMOS) transistors 901, 902, 903, a plurality of N-type metal oxide semiconductor (NMOS) transistors 904, 905, 906, and an inverter 912 formed by a PMOS transistor 907 and an NMOS transistor 908. PMOS transistor 901 and PMOS transistor 902 are coupled together in parallel via a source/drain terminal of each of PMOS transistor 901 and PMOS transistor 902. This source/drain terminal coupling is also coupled to a first source/drain terminal of PMOS transistor 903. A second source/drain terminal of PMOS transistor 903 is coupled to a source/drain terminal of each of NMOS transistor 904 and NMOS transistor 906 as well as to an input of inverter 912 (e.g., via gate terminals of PMOS transistor 907 and NMOS transistor 908). An output of the inverter 912 is provided at a coupling point between source/drain terminals of each of PMOS transistor 907 and NMOS transistor 908. Another source/drain terminal of NMOS transistor 904 is coupled to a source/drain terminal of NMOS transistor 905. NMOS transistor 905, NMOS transistor 906, and NMOS transistor 908 each have a source/drain terminal coupled to ground. PMOS transistor 901, PMOS transistor 902, and PMOS transistor 907 each have a source/drain terminal coupled to a supply voltage (e.g., VDD).

The gate terminal of PMOS transistor 901 and the gate terminal of NMOS 904 is coupled to a control signal A. The gate terminal of PMOS transistor 902 and the gate terminal of NMOS 905 is coupled to a scan input (SI) signal. The gate terminal of PMOS transistor 903 and the gate terminal of NMOS 906 is coupled to a control signal B.

FIG. 9B is a logic table 950 illustrating various signals of pre-setting combinational logic circuit 910 in accordance with various embodiments of the present disclosure. Operational PMOS or NMOS transistors act as closed switches, applying voltage from one of the source/drain terminals. PMOS or NMOS transistors that are non-operational act as open switches and no voltage is applied from one of the source/drain terminals. Generally speaking, PMOS transistors are in an "ON" state (e.g., operational) when the voltage applied at the gate terminal is a logic low '0'. NMOS transistors are in an "ON" state (e.g., operational) when the voltage applied to the gate terminal is a logic high '1'.

Logic table 950 includes different scenarios and signal inputs and outputs of pre-setting combinational logic circuit 910. In default scenario 952, pre-setting combinational logic circuit 910 is not used to pre-set the scan flip-flop 920. In default scenario 952, control signal A is set to a logic high '1'. This in turn causes PMOS transistor 901 to be in an "OFF" state (e.g., non-operational) and NMOS transistor

904 to be in an "ON" state (e.g., operational). Additionally, control signal B is set to a logic low '0' in default scenario 952. This in turn causes PMOS transistor 903 to be in an "ON" (e.g., operational) state and NMOS transistor 906 to be in an "OFF" (e.g., non-operational) state. In other words, in default scenario 952, NMOS transistor 904 is a closed switch that will be coupled to ground based on the scan input (SI) signal. If the scan input (SI) signal is present, that signal is provided to the input of inverter 912 via the closed switch (e.g., NMOS transistor 904). Inverter 912 then outputs an inverted version of the scan input (SI') to scan flip-flop 920. If the scan input (SI) signal is not present, then NMOS transistor 904 is floating as it is not coupled to any voltage or ground and the inverter receives no input signal. While PMOS transistor 903 is operational in the default scenario, it is floating as there is no connectivity to any voltage. As such, it essentially acts as an open switch in the default scenario 952. Using default scenario 952, a baseline output of output (Q) signal for scan flip-flop 920 is captured.

Pre-setting combinational logic circuit 910 can be used to pre-set scan flip-flop 920 to either a logic high '1' using set high scenario 954 or set low scenario 956. In the set high scenario 954, control signal A is a logic low '0'. This in turn causes PMOS transistor 901 to be an in "ON" state and NMOS transistor 904 to be in an "OFF" state. Additionally, in the set high scenario 954, control signal B is a logic high '1'. This in turn causes PMOS transistor 903 to be in an "OFF" state and NMOS transistor 906 to be in an "ON" state. In other words, in set high scenario 954 NMOS transistor 906 is a closed switch that connects the input of inverter 912 to ground (e.g., logic low '0'). Inverter 912 outputs the opposite its input, which is a logic high '1' to scan flip-flop 920. This operation is independent of the value of the scan input (SI). In other words, regardless if scan input (SI) is a logic high '1' or a logic low '0', the input to inverter 912 is still ground. This is because NMOS transistor 904 is an open switch and regardless of any voltage provided to PMOS transistor 903 being a closed switch via PMOS transistor 902 being a closed switch (e.g., when scan input (SI) is a logic low '0'), the input to inverter 912 is coupled to ground.

In the set low scenario 956, control signal A is a logic low '0' resulting in the same transistor operation described in set high scenario 954. In other words, PMOS transistor 901 is in an "ON" state and NMOS transistor 904 is in an "OFF" state. The difference between the set low scenario 956 and the set high scenario 954 is that control signal B is a logic low '0'. With control signal B set to a logic low '0', PMOS transistor 903 is in an "ON" state and NMOS transistor 906 is in an "OFF" state. In other words, a supply voltage is provided to the input of inverter 912 by way of closed switches PMOS transistor 901 and PMOS transistor 903. With voltage present at the input of inverter 912 (e.g., logic high '1'), inverter 912 outputs the opposite—a logic low '0' to scan flip-flop 920. The output of pre-setting combinational logic circuit 910 is independent of the scan input (SI) signal (e.g., regardless of whether the scan input (SI) signal is a logic high '1' or a logic low '0'). This is because in the set low scenario 956, NMOS transistor 904 and NMOS transistor 908 are both open switches. Additionally, when the scan input (SI) signal is a logic low '0' and PMOS transistor 902 is in an "ON" state, a voltage is still present on the input of inverter 912 such that its operation is the same as previously described.

Turning back to FIG. 9A, pre-setting combinational logic circuit 910 is coupled to scan flip-flop 920. More specifically, an output of inverter 912 (e.g., via the common coupling point of source/drain terminals of each of PMOS transistor 907 and NMOS transistor 908) is coupled to gate terminals of PMOS transistor 921 and NMOS transistor 922. Scan flip-flop 920 is made up of a plurality of transistors including PMOS transistors 921 and 923-931, NMOS transistors 922 and 932-940, and inverters 941-943. More particularly, PMOS transistors 921 and 923-926 and NMOS transistors 922, 932-933, and 935-936 are operably coupled to form scan mux input circuitry 960. PMOS transistors 927, 928, and 931, NMOS transistors 937, 938, and 934, and inverter 941 are operably coupled to form master latch circuitry 970. The master latch circuitry 970 includes a first set of cross-coupled inverters formed by inverter 941 and an inverter formed by PMOS transistor 931 and NMOS transistor 934. PMOS transistor 931 and NMOS transistor 934 are selectively enabled based on clock signals clkb and clkbb, respectively. Clock signals clkb and clkbb are generated by inverters 981, 982 of clock circuitry 980 based on an input clock signal, CP. In other words, clock signal clkb is the opposite (or inverted) of input clock signal, CP, as it is inverted using inverter 981. Clock signal clkbb is the opposite (or inverted) of clock signal, clkb, as it is inverted using inverter 982.

A transmission gate formed by PMOS transistor 931 and NMOS transistor 934 couples the master latch circuitry 970 to slave latch circuitry 980. PMOS transistors 929, 930, NMOS transistors 939, 940, and inverter 942 are operably coupled to form slave latch circuitry 980. Slave latch circuitry 980 includes cross-coupled inverters formed by inverter 942 and PMOS transistors 929, 930 and NMOS transistors 939, 940. PMOS transistors 929, 930 and NMOS transistors 939, 940 form an inverter that is selectively enabled based on clkb and clkbb. Data out circuitry includes an inverter 943, which inverts the output of the slave latch circuitry 990 such that the output Q has the same polarity (e.g., is non-inverted) with regards to the original data inputs D of PMOS transistor 925 and SI' of PMOS transistor 921 and NMOS transistor 922. The inverted sense enable signal, SEN, is generated by inverter 995 to be the opposite of the sense enable signal, SE.

Figures 10A, 10B:
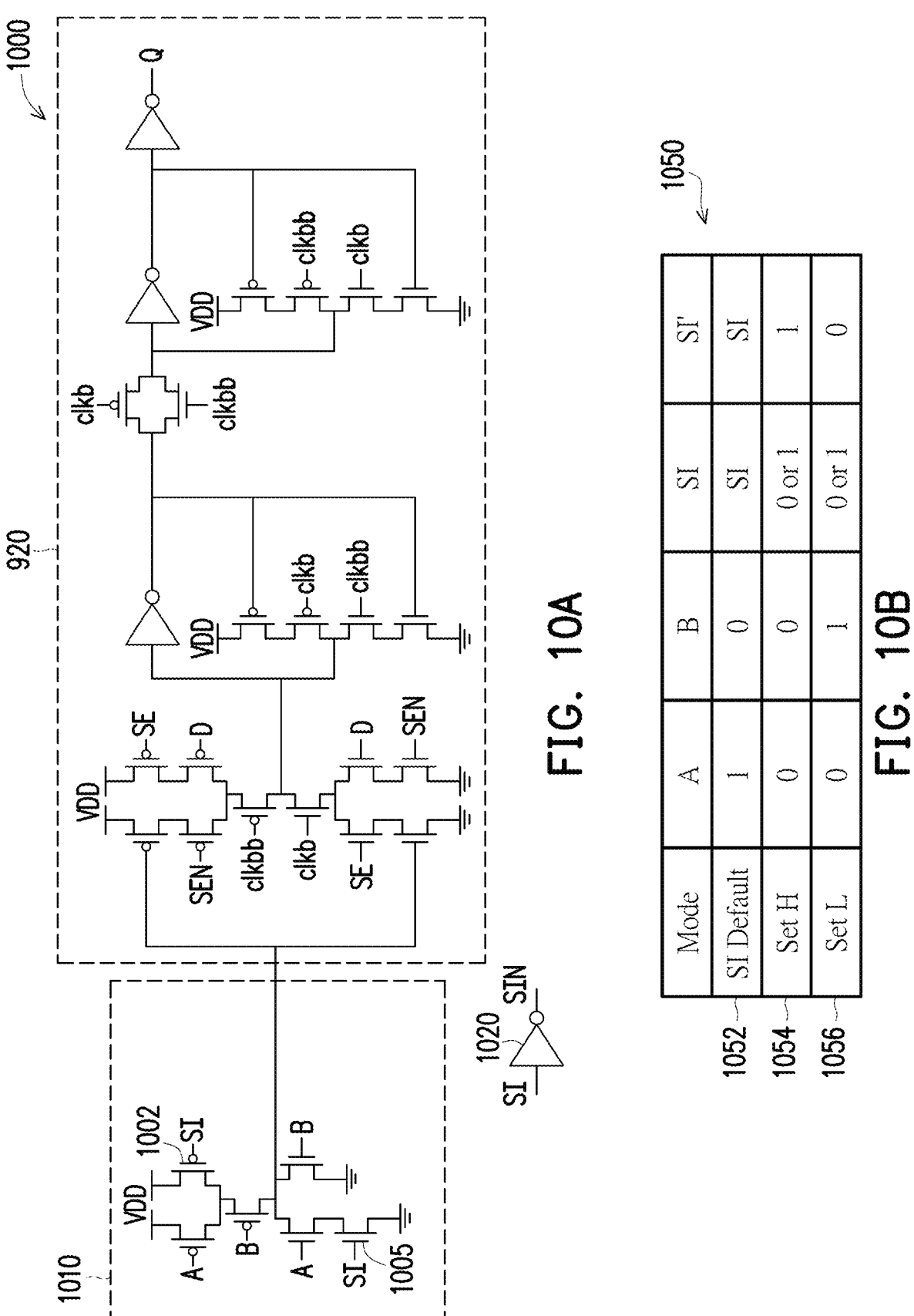
FIG. 10A is an electrical schematic illustrating another example pre-settable scan flip-flop circuit in accordance with various embodiments of the present disclosure.
FIG. 10B is a logic table illustrating various signals of pre-setting combinational logic circuit in accordance with various embodiments of the present disclosure.

FIG. 10A is an electrical schematic illustrating another example pre-settable scan flip-flop circuit 1000 in accordance with various embodiments of the present disclosure. Pre-settable scan flip-flop circuit 1000 includes a pre-setting combinational logic circuit 1010 electrically coupled to a scan flip-flop 920. Similar to pre-settable scan flip-flop circuit 900 of FIG. 9A, pre-setting combinational logic circuit 1010 is on the front end of the scan flip-flop 920 (e.g., pre-set arrangement 200).

The pre-settable scan flip-flop circuit 1000 differs from pre-settable scan flip-flop circuit 900 in that pre-setting combinational logic circuit 1010 excludes the inverter 912. Instead, pre-settable scan flip-flop circuit 1010 is coupled to scan flip-flop 1020 via a commonly coupled source/drain terminal of PMOS transistor 903 and NMOS transistors 904, 906. In other words, instead of this commonly coupled source/drain terminal being coupled to an input of inverter 912 (as in pre-settable scan flip-flop circuit 900), it is coupled to the gate terminals of PMOS transistor 921 and NMOS transistor 922 of scan flip-flop 920. Additionally, the gate terminals of PMOS transistor 1002 and NMOS transistor 1005 of pre-setting combinational logic circuit 1010 receives an inverted scan input (SIN) signal as opposed to the scan input (SI) signal in pre-setting combinational logic circuit 910. The inverted scan input (SIN) signal is generated by inverter 1020. All other components, electrical connections, inputs, and outputs described with respect to FIG. 9A apply to the pre-settable scan flip-flop circuit 1000 of FIG. 10A.

FIG. 10B is a logic table 1050 illustrating various signals of pre-setting combinational logic circuit 1010 in accordance with various embodiments of the present disclosure. Like logic table 950, logic table 1050 includes different scenarios and signal inputs and outputs of pre-setting combinational logic circuit 1010. In default scenario 1052, pre-setting combinational logic circuit 1010 is not used to pre-set the scan flip-flop 920. The transistors of pre-setting combinational logic circuit 1010 operate as previously described in default scenario 952, with the exception that NMOS transistor 902 and PMOS transistor 905 operate based on the inverted scan input (SIN) signal as opposed to the scan input (SI).

Pre-setting combinational logic circuit 1010 can be used to pre-set scan flip-flop 920 to either a logic high '1' using set high scenario 1054 or a logic low '0' using set low scenario 1056. In the set low scenario 1056, control signal A is a logic low '0'. This in turn causes PMOS transistor 901 to be an in "ON" state and NMOS transistor 904 to be in an "OFF" state. Additionally, in the set low scenario 1056, control signal B is a logic high '1'. The transistors of pre-setting combinational logic circuit 1010 operate in the set low scenario 1056 a described relative to the set high scenario 954. In the set high scenario 1054, control signal A and control signal B are both set to a logic low '0', resulting in the transistors (except those in inverter 912) operating in the same manner as described in the set low scenario 956.

Figure 11A:
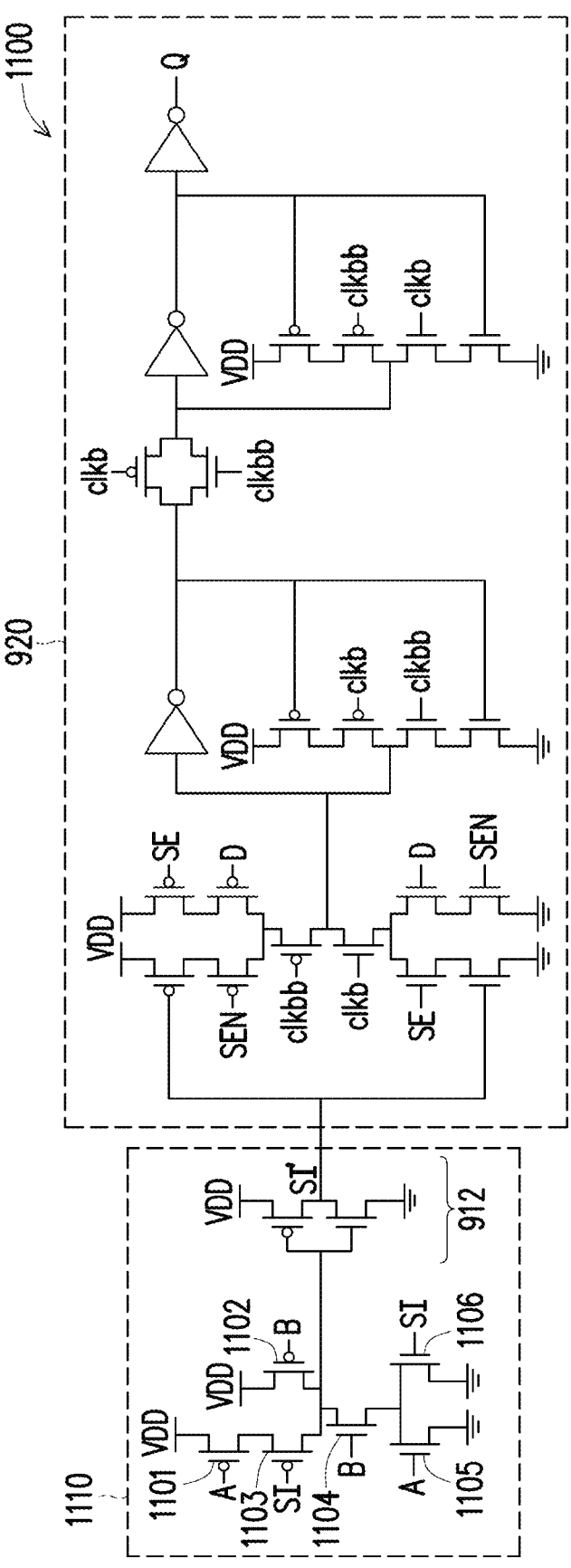
FIG. 11A is an electrical schematic illustrating another example pre-settable scan flip-flop circuit in accordance with various embodiments of the present disclosure.

FIG. 11A is an electrical schematic illustrating another example pre-settable scan flip-flop circuit 1100 in accordance with various embodiments of the present disclosure. Pre-settable scan flip-flop circuit 1100 includes a pre-setting combinational logic circuit 1110 electrically coupled to a scan flip-flop 920. Like pre-settable scan flip-flop circuit 900 and pre-settable scan flip-flop circuit 1000, pre-setting combinational logic circuit 1110 is on the front end of the scan flip-flop 920 (e.g., pre-set arrangement 200).

Pre-setting combinational logic circuit 1110 includes the same components as pre-setting combinational logic circuit 910 with different electrical couplings and inputs. For example, pre-setting combinational logic circuit 1110 includes PMOS transistors 1101, 1102, 1103, NMOS transistors 1104, 1105, 1106, and inverter 912. A source/drain terminal of each of PMOS transistors 1101 and 1102 are coupled to a supply voltage (e.g., VDD). Another source/drain terminal of PMOS transistor 1101 is coupled to a source/drain terminal of PMOS transistor 1103. Another source/drain terminal of PMOS transistor 1103 is commonly coupled to another source/drain terminal of PMOS transistor 1102 and a source/drain terminal of NMOS transistor 1104. This common coupling point is coupled to an input of inverter 912. Another source drain terminal of NMOS transistor 904 is commonly coupled to a source/drain terminal of NMOS transistor 1105 and a source/drain terminal of NMOS 1106. The other source/drain terminals of each of NMOS transistors 1105, 1106 are coupled to electrical ground.

A gate terminal of each of PMOS transistor 1101 and NMOS transistor 1105 is coupled to a control signal A. A gate terminal of each of PMOS transistor 1102 and NMOS transistor 1104 is coupled to a control signal B. A gate terminal of each of PMOS transistor 1103 and NMOS transistor 1106 are coupled to a scan input (SI) signal. All other components, electrical connections, inputs, and outputs described with respect to FIG. 9A apply to the pre-settable scan flip-flop circuit 1100 of FIG. 11A.

Figure 11B:
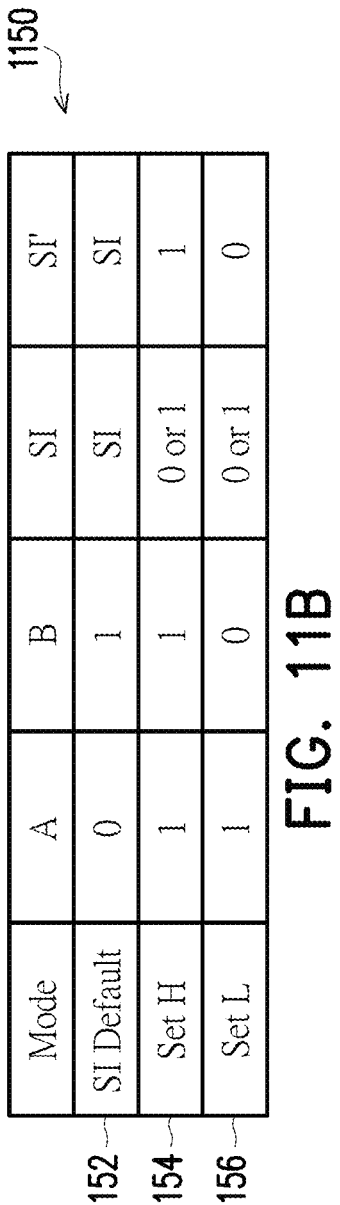
FIG. 11B is a logic table illustrating various signals of pre-setting combinational logic circuit in accordance with various embodiments of the present disclosure.

FIG. 11B is a logic table 1150 illustrating various signals of pre-setting combinational logic circuit 1110 in accordance with various embodiments of the present disclosure. Like logic tables 950, 1050, logic table 1150 includes different scenarios and signal inputs and outputs of pre-setting combinational logic circuit 910. In default scenario 1152, pre-setting combinational logic circuit 1110 is not used to pre-set the scan flip-flop 920. In default scenario 1152, control signal A is set to a logic low '0'. This in turn causes NMOS transistor 1105 to be in an "OFF" state (e.g., non-operational) and PMOS transistor 1101 to be in an "ON" state (e.g., operational). Additionally, control signal B is set to a logic high '1' in default scenario 1152. This in turn causes NMOS transistor 1104 to be in an "ON" (e.g., operational) state and PMOS transistor 1102 to be in an "OFF" (e.g., non-operational) state. In other words, in default scenario 1152, PMOS transistor 1101 is a closed switch that will be coupled to the input of inverter 912 based on the scan input (SI) signal. If the scan input (SI) signal is not present, VDD is provided to the input of inverter 912 via the closed switches (e.g., PMOS transistors 1101, 1103) as NMOS transistor will be in an "OFF" (e.g., non-operational) state. With VDD provided to the input of inverter 912, the output of inverter 912 is also a logic low '0' (e.g., the same as the scan input (SI) signal), which is provided as input to scan flip-flop 920. If the scan input (SI) signal is present, then PMOS transistor 1101 is floating as it is not coupled to any voltage or ground and the inverter input of inverter 912 is grounded via closed switches (e.g., NMOS transistors 1104, 1106). Thus, the output of inverter is also equivalent to the scan input (SI) signal. Using default scenario 1152, a baseline output of output (Q) signal for scan flip-flop 920 is captured.

Like pre-setting combinational logic circuits 910, 1010, pre-setting combinational logic circuit 1110 can be used to pre-set scan flip-flop 920 to either a logic high '1' using set high scenario 1154 or set low scenario 1156. In the set high scenario 1154, control signal A is a logic high '1'. This in turn causes PMOS transistor 1101 to be an in "OFF" state and NMOS transistor 1105 to be in an "ON" state. Additionally, in the set high scenario 1154, control signal B is a logic high '1', which results in the same operation described with respect to default scenario 1152. In other words, the PMOS transistor 1103 will be floating and not receive the supply voltage, VDD, as PMOS transistor 1101 is an open switch. NMOS transistors 1104, 1105 operate as closed switches in this scenario, which connects the input of inverter 912 to ground (e.g., logic low '0'). Inverter 912 outputs the opposite its input, which is a logic high '1' to scan flip-flop 920. This operation is independent of the value of the scan input (SI). In other words, regardless if scan input (SI) is a logic high '1' or a logic low '0', the input to inverter 912 is still coupled to ground. This is because PMOS transistor 1101 is an open switch and no voltage is provided to PMOS transistor 1103.

In the set low scenario 1156, control signal A is a logic high '1' resulting in the same transistor operation described in set high scenario 1154. In other words, PMOS transistor 1101 is in an "OFF" state and NMOS transistor 1105 is in an "ON" state. The difference between the set low scenario 1156 and the set high scenario 1154 is that control signal B is a logic low '0'. With control signal B set to a logic low '0', PMOS transistor 1102 is in an "ON" state and NMOS transistor 1104 is in an "OFF" state. In other words, a supply voltage is provided to the input of inverter 912 by way of closed switch PMOS transistor 1102 and the input is no longer coupled to ground as NMOS transistor 1104 is an open switch. With voltage present at the input of inverter 912 (e.g., logic high '1'), inverter 912 outputs the opposite—a logic low '0' to scan flip-flop 920. The output of pre-setting combinational logic circuit 1110 is independent of the scan input (SI) signal (e.g., regardless of whether the scan input (SI) signal is a logic high '1' or a logic low '0'). This is because in the set low scenario 1156, PMOS transistor 1102 is a closed switch independent of the scan input (SI) signal.

Figure 12A:
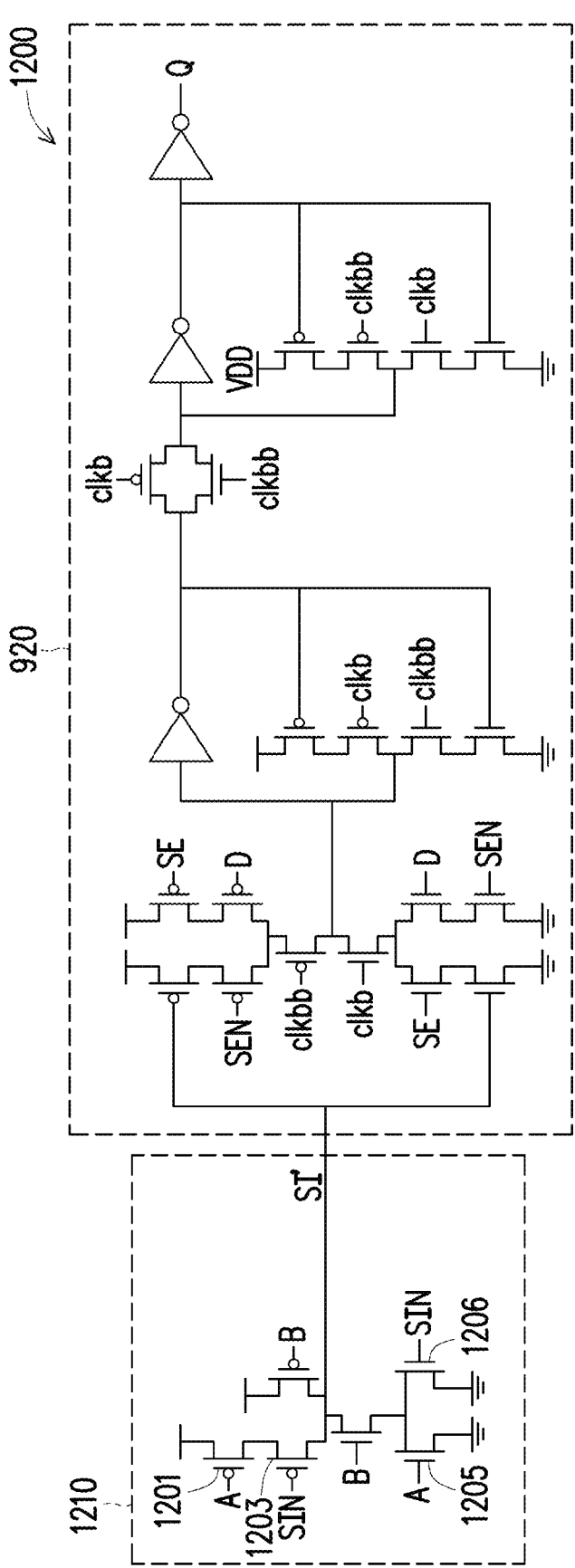
FIG. 12A is an electrical schematic illustrating another example pre-settable scan flip-flop circuit in accordance with various embodiments of the present disclosure.

FIG. 12A is an electrical schematic illustrating another example pre-settable scan flip-flop circuit 1200 in accordance with various embodiments of the present disclosure. Pre-settable scan flip-flop circuit 1200 includes a pre-setting combinational logic circuit 1210 electrically coupled to a scan flip-flop 920. Like pre-setting combinational logic circuits 910, 1010, 1110, pre-setting combinational logic circuit 1210 is on the front end of the scan flip-flop 920 (e.g., pre-set arrangement 200). Pre-setting combinational logic circuit 1210 includes the same components as pre-setting combinational logic circuit 1110, except that pre-setting combinational logic circuit 1210 does not include inverter 912.

Figure 12B:
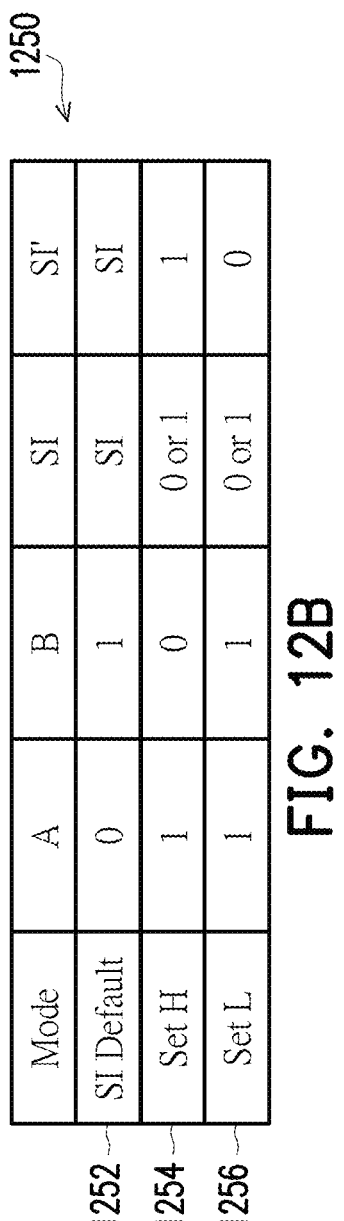
FIG. 12B is a logic table illustrating various signals of pre-setting combinational logic circuit in accordance with various embodiments of the present disclosure.

FIG. 12B is a logic table 1250 illustrating various signals of pre-setting combinational logic circuit 1210 in accordance with various embodiments of the present disclosure. Like logic table 1250, logic table 1250 includes different scenarios and signal inputs and outputs of pre-setting combinational logic circuit 1210. In default scenario 1252, pre-setting combinational logic circuit 1210 is not used to pre-set the scan flip-flop 920. The transistors of pre-setting combinational logic circuit 1210 operate as previously described in default scenario 1152, with the exception that NMOS transistor 1206 and PMOS transistor 1203 operate based on the inverted scan input (SIN) signal as opposed to the scan input (SI).

Pre-setting combinational logic circuit 1210 can be used to pre-set scan flip-flop 920 to either a logic high '1' using set high scenario 1254 or a logic low '0' using set low scenario 1256. In the set low scenario 1256, control signal A is a logic high '1'. This in turn causes NMOS transistor 1205 to be an in "ON" state and PMOS transistor 1201 to be in an "OFF" state. Additionally, in the set low scenario 1256, control signal B is a logic high '1'. The transistors of pre-setting combinational logic circuit 1210 operate in the set low scenario 1256 as described relative to the set high scenario 1154. In the set high scenario 1254, control signal A and control signal B are both set to a logic high '1', resulting in the transistors (except those in inverter 912) operating in the same manner as described in the set low scenario 1056.

Figure 13:
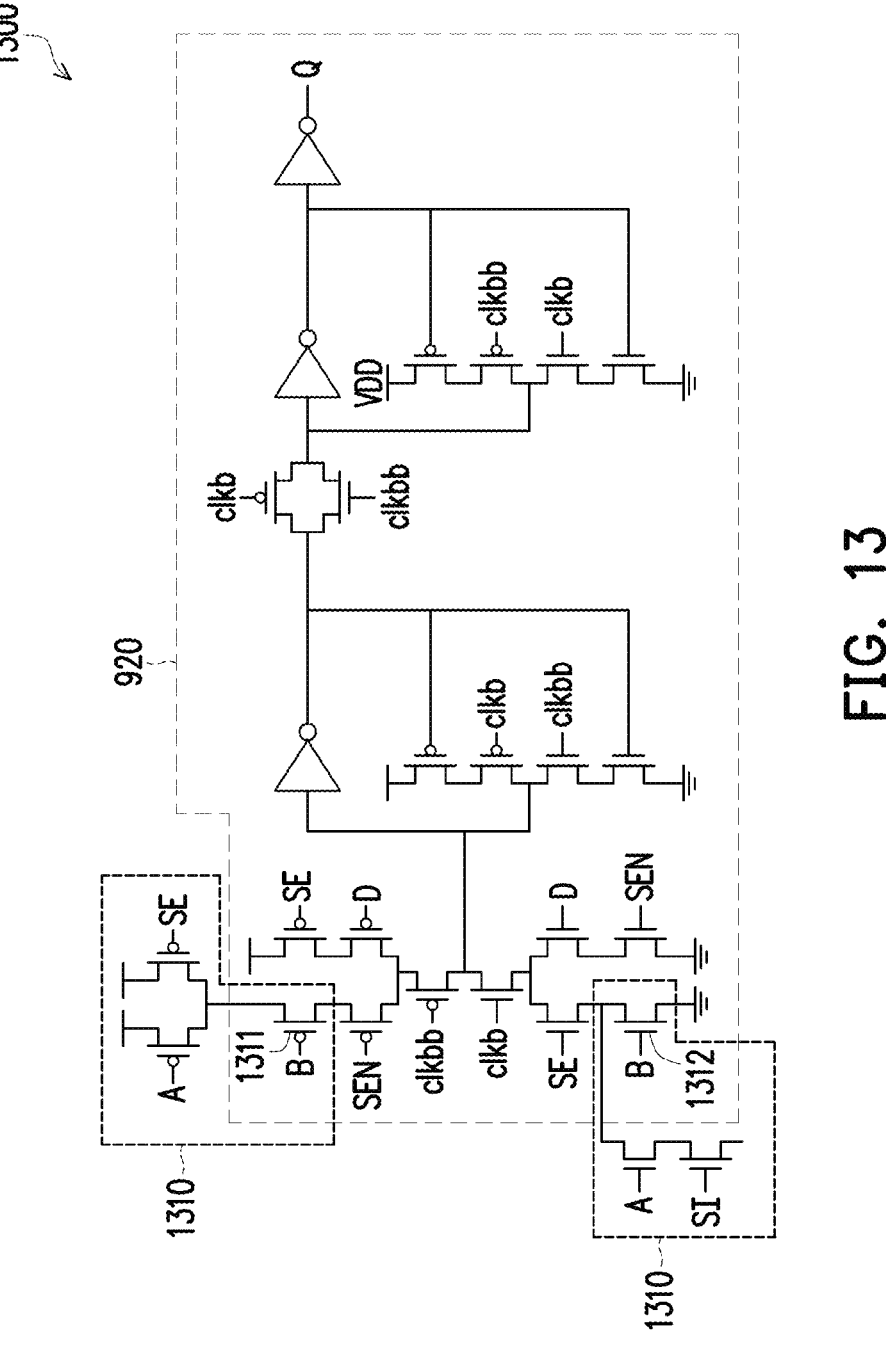
FIG. 13 is an electrical schematic illustrating another example pre-settable scan flip-flop circuit in accordance with various embodiments of the present disclosure.

FIG. 13 is an electrical schematic illustrating another example pre-settable scan flip-flop circuit 1300 in accordance with various embodiments of the present disclosure. Pre-settable scan flip-flop circuit 1300 includes a pre-setting combinational logic circuit 1310 electrically coupled to a scan flip-flop 920. Similar to pre-settable scan flip-flop circuits 900, 1000, 1100, 1200 of FIGS. 9A, 10A, 11A, and 12A, respectively, pre-setting combinational logic circuit 1310 is on the front end of the scan flip-flop 920 (e.g., pre-set arrangement 200).

The pre-settable scan flip-flop circuit 1310 has similar components, couplings, and operation to pre-settable scan flip-flop circuit 910 except that pre-setting combinational logic circuit 1310 shares (or re-purposes) transistors in the scan flip-flop 920 and it does not include inverter 912. For example, PMOS transistor 1311 is a transistor shared by pre-setting combinational logic circuit 1310 as well as scan flip-flop 920. PMOS transistor 1311 has the same electrical couplings described with respect to scan flip-flop, except that instead of receiving an output of inverter 912 (as described relative to PMOS transistor 921), it receives control signal B as described with respect to PMOS transistor 903. PMOS transistor 1311 is coupled between, via its source/drain terminals, a common coupling point of source/drain terminals of each of PMOS transistors 901, 902 and a source/drain terminal of PMOS transistor 923. Similarly, NMOS transistor 1312 is a transistor shared by pre-setting combinational logic circuit 1310 as well as scan flip-flop 920. NMOS transistor 1312 has the same electrical couplings described with respect to scan flip-flop 920, except that instead of receiving an output of inverter 912 (as described relative to NMOS transistor 922), it receives control signal B as described with respect to NMOS transistor 906. NMOS transistor 1312 is coupled between, via its source/drain terminals, a common coupling point of source/drain terminals of each of NMOS transistors 904, 926 and ground. The shared transistors (e.g., PMOS transistor 1311 and NMOS transistor 1312) occupies less physical space than the configuration illustrated in FIG. 9A. All other components, electrical connections, inputs, and outputs described with respect to FIG. 9A apply to the pre-settable scan flip-flop circuit 1300 of FIG. 13. The operation of pre-setting combinational logic circuit 1310 is the same as described with respect to pre-setting combinational logic circuit 910 (absent inverter 912) as described in detail in FIG. 9B.

Figure 14:
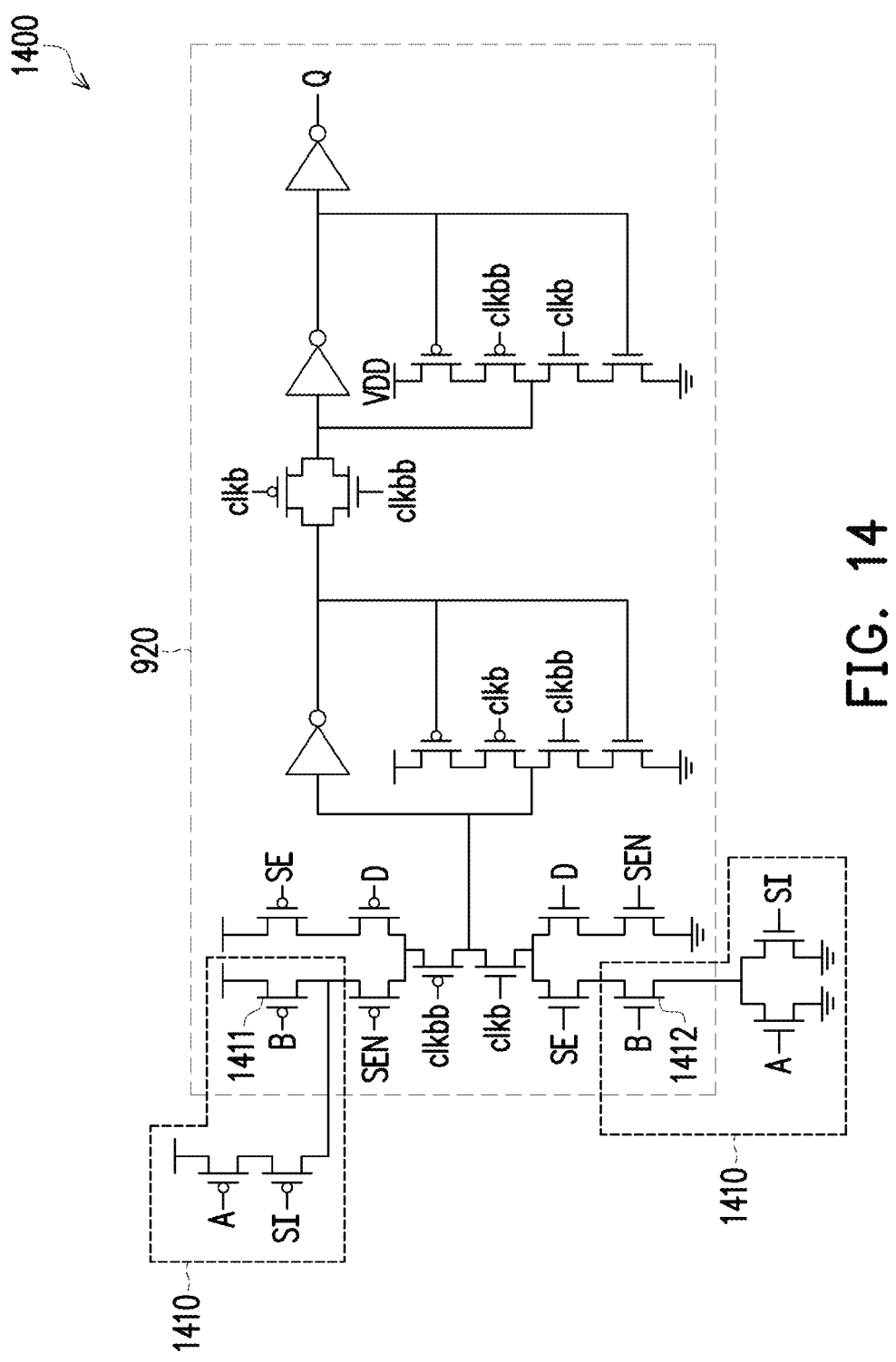
FIG. 14 is an electrical schematic illustrating another example pre-settable scan flip-flop circuit in accordance with various embodiments of the present disclosure.

FIG. 14 is an electrical schematic illustrating another example pre-settable scan flip-flop circuit 1400 in accordance with various embodiments of the present disclosure. Pre-settable scan flip-flop circuit 1400 includes a pre-setting combinational logic circuit 1410 electrically coupled to a scan flip-flop 920. Similar to pre-settable scan flip-flop circuits 900, 1000, 1100, 1200, 1300 of FIGS. 9A, 10A, 11A, 12A, and 13, respectively, pre-setting combinational logic circuit 1410 is on the front end of the scan flip-flop 920 (e.g., pre-set arrangement 200).

The pre-settable scan flip-flop circuit 1410 has similar components, couplings, and operation to pre-settable scan flip-flop circuit 1110, but differs in that pre-setting combinational logic circuit 1410 shares (or re-purposes) transistors in the scan flip-flop 920 and it does not include inverter 912. For example, PMOS transistor 1411 is a transistor shared by pre-setting combinational logic circuit 1410 as well as scan flip-flop 920. PMOS transistor 1411 has the same electrical couplings described with respect to scan flip-flop 920, except that instead of receiving an output of inverter 912 (as described relative to PMOS transistor 921), it receives control signal B as described with respect to PMOS transistor 1102. PMOS transistor 1411 is coupled to, via one of its source/drain terminals, a source/drain terminal of each of PMOS transistor 923 and PMOS transistor 1103. Similarly, NMOS transistor 1412 is a transistor shared by pre-setting combinational logic circuit 1410 as well as scan flip-flop 920. NMOS transistor 1312 has the same electrical couplings described with respect to scan flip-flop 920, except that instead of receiving an output of inverter 912 (as described relative to NMOS transistor 922), it receives control signal B as described with respect to NMOS transistor 1104. NMOS transistor 1412 is coupled between, via its source/drain terminals, a common coupling point of source/drain terminals of each of NMOS transistors 1105, 1106 and a source/drain terminal of NMOS transistor 936.

The shared transistors (e.g., PMOS transistor 1411 and NMOS transistor 1412) occupies less physical space than the configuration illustrated in FIG. 11A. All other components, electrical connections, inputs, and outputs described with respect to FIG. 11A apply to the pre-settable scan flip-flop circuit 1400 of FIG. 14. The operation of pre-setting combinational logic circuit 1410 is the same as described with respect to pre-setting combinational logic circuit 1110 (absent inverter 912) as described in detail in FIG. 11B.

Figure 15A:
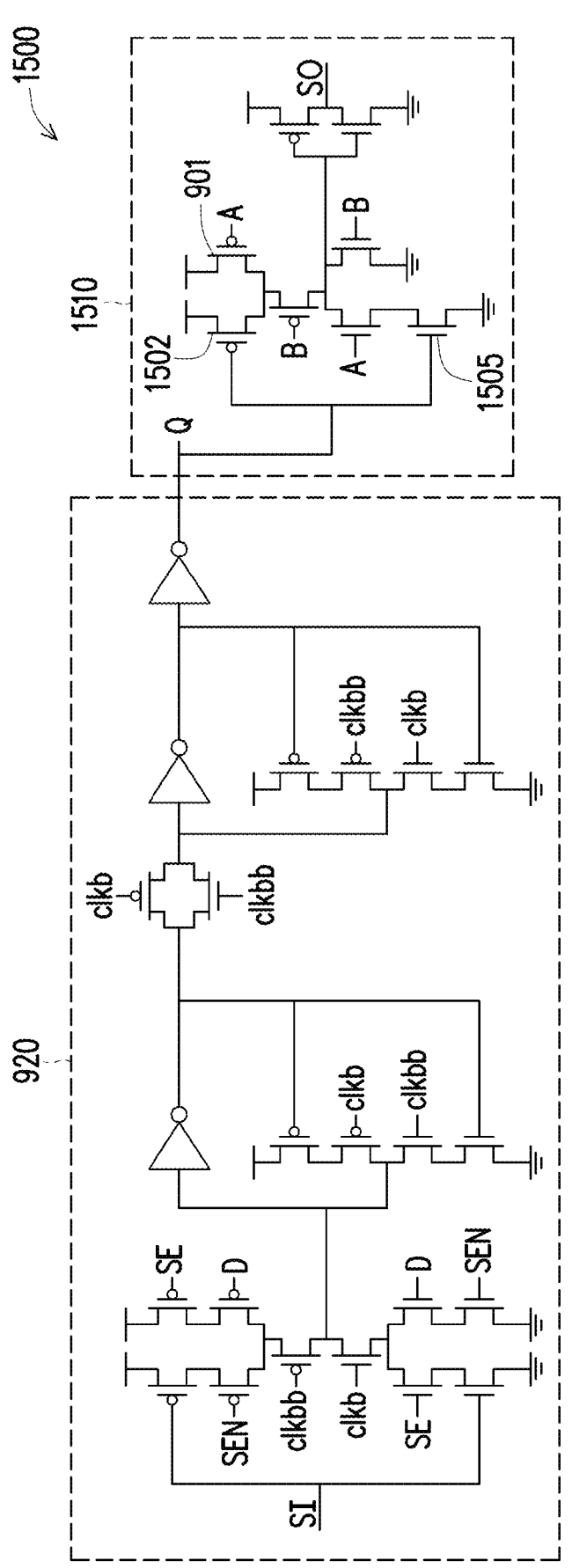
FIG. 15A is an electrical schematic illustrating another example pre-settable scan flip-flop circuit in accordance with various embodiments of the present disclosure.

FIG. 15A is an electrical schematic illustrating another example pre-settable scan flip-flop circuit 1500 in accordance with various embodiments of the present disclosure. Pre-settable scan flip-flop circuit 1500 includes a pre-setting combinational logic circuit 1510 electrically coupled to a scan flip-flop 920. Pre-setting combinational logic circuit 1510 is on the back end of the scan flip-flop 920 (e.g., pre-set arrangement 250).

Pre-setting combinational logic circuit 1510 has similar components, couplings, and operation to pre-setting combinational logic 910 except that the control signals of some transistors differ. For example, pre-setting combinational logic circuit 1510 is coupled to an output (Q) signal of the scan flip-flop 920. The output (Q) signal is coupled to gate terminals of PMOS transistor 1502 and NMOS transistor 1505, whereas equivalent PMOS transistor 902 and NMOS transistor 905 receive a scan input (SI) signal. In other words, rather than receive a scan input (SI) signal with pre-setting combinational logic circuit 910 on the frontend, with pre-setting combinational logic circuit 1510 on the backend, it receives the output (Q) signal of scan flip-flop 920. The operation of pre-setting combinational logic circuit 1510 is the same as described with respect to pre-setting combinational logic circuit 910 as described in detail in FIGS. 9A-9B, with the exception that the scan input (SI) signal is replaced with the output (Q) signal.

Figure 15B:
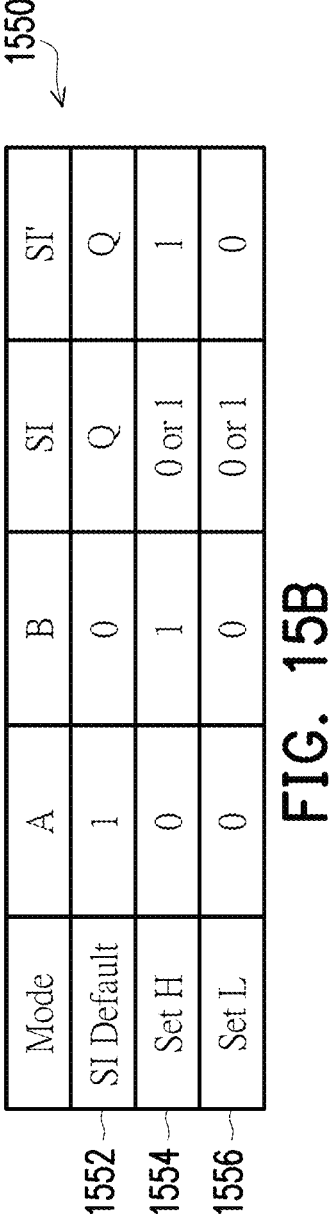
FIG. 15B is a logic table illustrating various signals of pre-setting combinational logic circuit in accordance with various embodiments of the present disclosure.

FIG. 15B is a logic table 1550 illustrating various signals of pre-setting combinational logic circuit 1510 in accordance with various embodiments of the present disclosure. Logic scenario includes default scenario 1552, set high scenario 1554, and set low scenario 1556. All of these scenarios are the same as previously described with respect to logic table 950, except that the default scenario 1552 outputs the output (Q) signal of scan flip-flop 920, rather than the scan input (SI) signal.

Figures 16A, 16B:
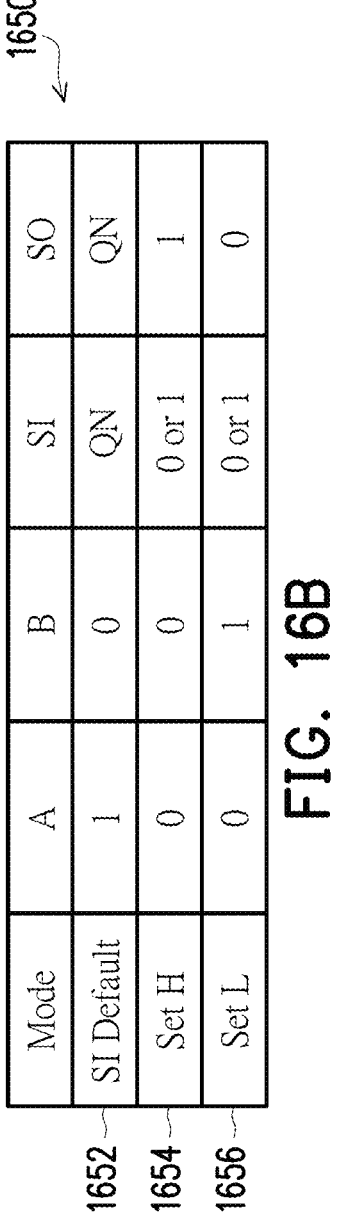
FIG. 16A is an electrical schematic illustrating another example pre-settable scan flip-flop circuit in accordance with various embodiments of the present disclosure.
FIG. 16B is a logic table illustrating various signals of pre-setting combinational logic circuit in accordance with various embodiments of the present disclosure.

FIG. 16A is an electrical schematic illustrating another example pre-settable scan flip-flop circuit 1600 in accordance with various embodiments of the present disclosure. Pre-settable scan flip-flop circuit 1600 includes a pre-setting combinational logic circuit 1610 electrically coupled to a scan flip-flop 1620. Pre-setting combinational logic circuit 1510 is on the back end of the scan flip-flop 920 (e.g., pre-set arrangement 250).

Scan flip-flop 1620 has similar components, couplings, and operation to scan flip-flop 920 except that it does not include inverter 943. Instead, an inverter 1630 is coupled to the same coupling point on the input of inverter 942. Additionally, pre-settable scan flip-flop circuit 1600 is has similar components, couplings, and operation to pre-settable scan flip-flop circuit 1500 of FIG. 15, except that pre-setting combinational logic circuit 1610 receives an inverted output (QN) from scan flip-flop 1620, rather than the output (Q) signal of scan flip-flop 920. Inverter 1630 outputs the inverted output (QN) of scan flip-flop 1620. The inverted output (QN) is provided to the gate terminals of PMOS transistor 1602 and NMOS transistor 1605, whereas equivalent the PMOS transistor 1502 and NMOS transistor 1505 receive the output (Q) signal of scan flip-flop 920. The operation of pre-setting combinational logic circuit 1610 is the same as described with respect to pre-setting combinational logic circuit 910 as described in detail in FIGS. 9A-9B, with the exception that the scan input (SI) signal is replaced with the inverted output (QN) signal.

FIG. 16B is a logic table 1650 illustrating various signals of pre-setting combinational logic circuit 1610 in accordance with various embodiments of the present disclosure. Logic scenario includes default scenario 1652, set high scenario 1654, and set low scenario 1656. All of these scenarios are the same as previously described with respect to logic table 1050, except that the default scenario 1652 outputs the inverted output (QN) of scan flip-flop 620, rather than the scan input (SI) signal.

Figures 17A, 17B:
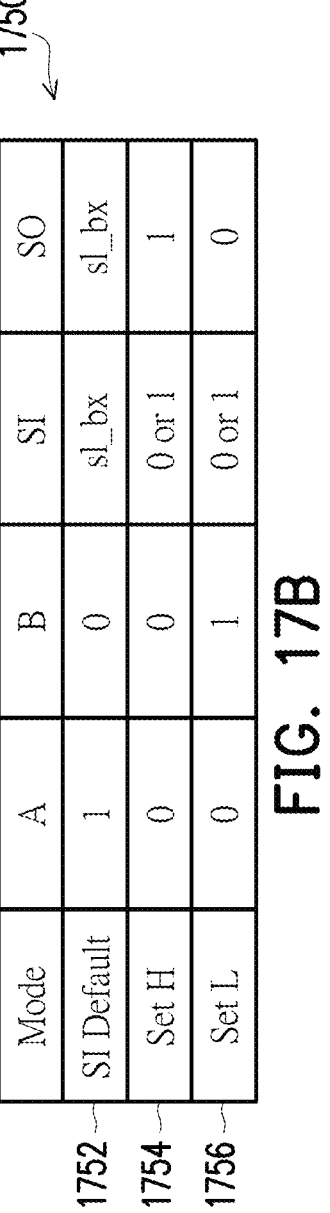
FIG. 17A is an electrical schematic illustrating another example pre-settable scan flip-flop circuit in accordance with various embodiments of the present disclosure.
FIG. 17B is a logic table illustrating various signals of pre-setting combinational logic circuit in accordance with various embodiments of the present disclosure.

FIG. 17A is an electrical schematic illustrating another example pre-settable scan flip-flop circuit 1700 in accordance with various embodiments of the present disclosure. Pre-settable scan flip-flop circuit 1700 includes a pre-setting combinational logic circuit 1710 electrically coupled to a scan flip-flop 920. Pre-setting combinational logic circuit 1710 is on the back end of the scan flip-flop 920 (e.g., pre-set arrangement 250).

Pre-setting combinational logic circuit 1710 has similar components, couplings, and operation similar to pre-setting combinational logic 1510 except that the control signals of some transistors differ. For example, pre-setting combinational logic circuit 1710 is coupled to the gate terminals of PMOS transistor 929 and NMOS transistor 940 as well as the input of inverter 943 of the scan flip-flop 920. The signal at this coupling point, denoted as sl_bx, is coupled to the gate terminals of PMOS transistor 1702 (e.g., equivalent to PMOS transistor 902) and NMOS transistor 1705 (e.g., equivalent to NMOS transistor 905). The operation of pre-setting combinational logic circuit 1710 is the same as described with respect to pre-setting combinational logic circuit 910 as described in detail in FIGS. 9A-9B, with the exception that the scan input (SI) signal is replaced with the signal sl_bx.

FIG. 17B is a logic table 1750 illustrating various signals of pre-setting combinational logic circuit 1710 in accordance with various embodiments of the present disclosure. Logic scenario includes default scenario 1752, set high scenario 1754, and set low scenario 1756. All of these scenarios are the same as previously described with respect to logic table 1050, except that the default scenario 1752 outputs the sl_bx signal of scan flip-flop 920, rather than the scan input (SI) signal.

Figures 18A, 18B:
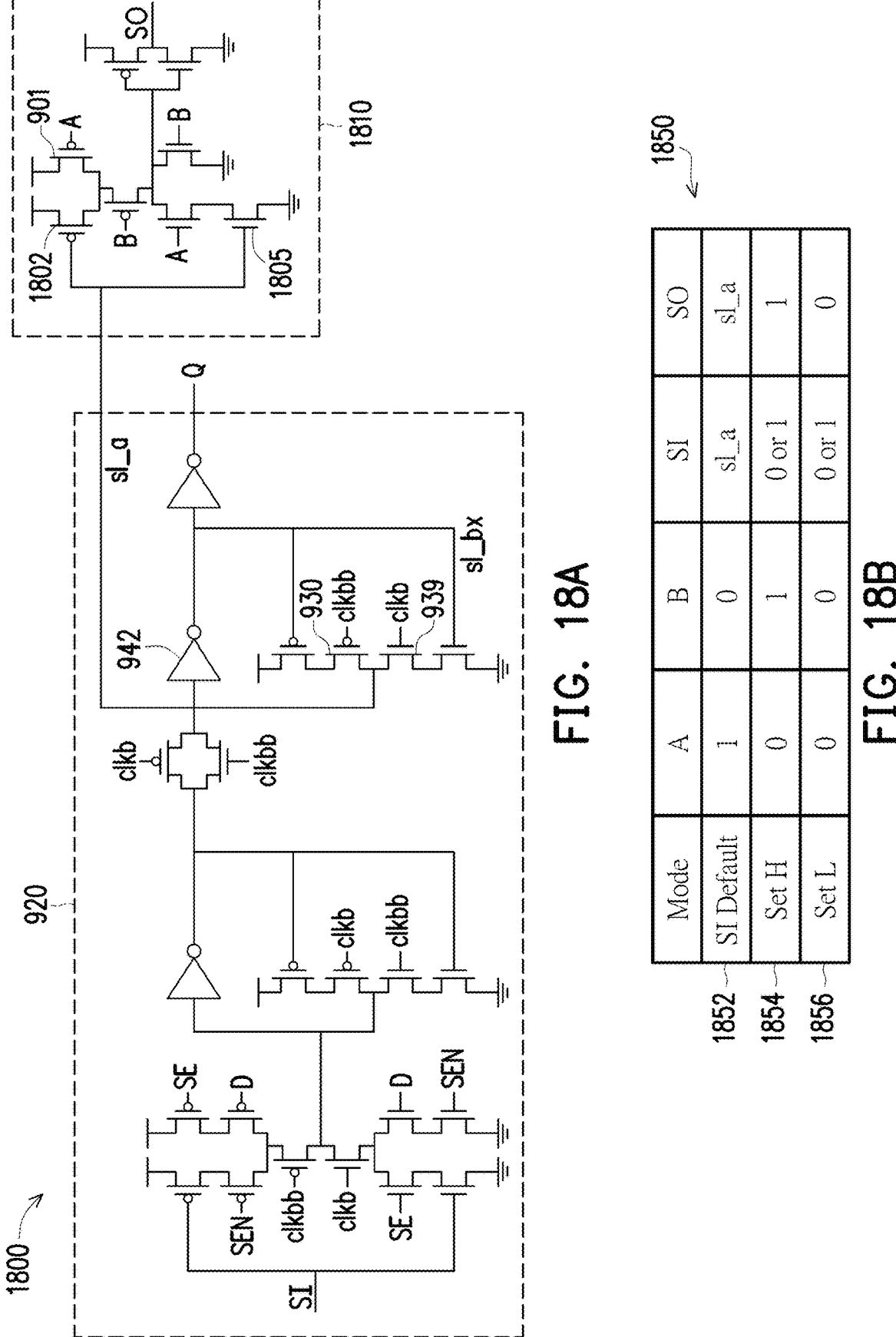
FIG. 18A is an electrical schematic illustrating another example pre-settable scan flip-flop circuit in accordance with various embodiments of the present disclosure.
FIG. 18B is a logic table illustrating various signals of pre-setting combinational logic circuit in accordance with various embodiments of the present disclosure.

FIG. 18A is an electrical schematic illustrating another example pre-settable scan flip-flop circuit 1800 in accordance with various embodiments of the present disclosure. Pre-settable scan flip-flop circuit 1800 includes a pre-setting combinational logic circuit 1810 electrically coupled to a scan flip-flop 920. Pre-setting combinational logic circuit 1810 is on the back end of the scan flip-flop 920 (e.g., pre-set arrangement 250).

Pre-setting combinational logic circuit 1810 has similar components, couplings, and operation to pre-setting combinational logic 910 except that the control signals of some transistors differ. For example, pre-setting combinational logic circuit 1810 is coupled to the gate terminals of PMOS transistor 930 and NMOS transistor 939 as well as the input of inverter 942 of the scan flip-flop 920. The signal at this coupling point, denoted as sl_a, is coupled to the gate terminals of PMOS transistor 1802 (e.g., equivalent to PMOS transistor 902) and NMOS transistor 1805 (e.g., equivalent to NMOS transistor 905). The operation of pre-setting combinational logic circuit 1810 is the same as described with respect to pre-setting combinational logic circuit 910 as described in detail in FIGS. 9A-9B, with the exception that the scan input (SI) signal is replaced with the signal sl_a.

FIG. 18B is a logic table 1850 illustrating various signals of pre-setting combinational logic circuit 1810 in accordance with various embodiments of the present disclosure. Logic scenario includes default scenario 1852, set high scenario 1854, and set low scenario 1856. All of these scenarios are the same as previously described with respect to logic table 950, except that the default scenario 1852 outputs the sl_a signal of scan flip-flop 920, rather than the scan input (SI) signal.

Figures 19A, 19B:
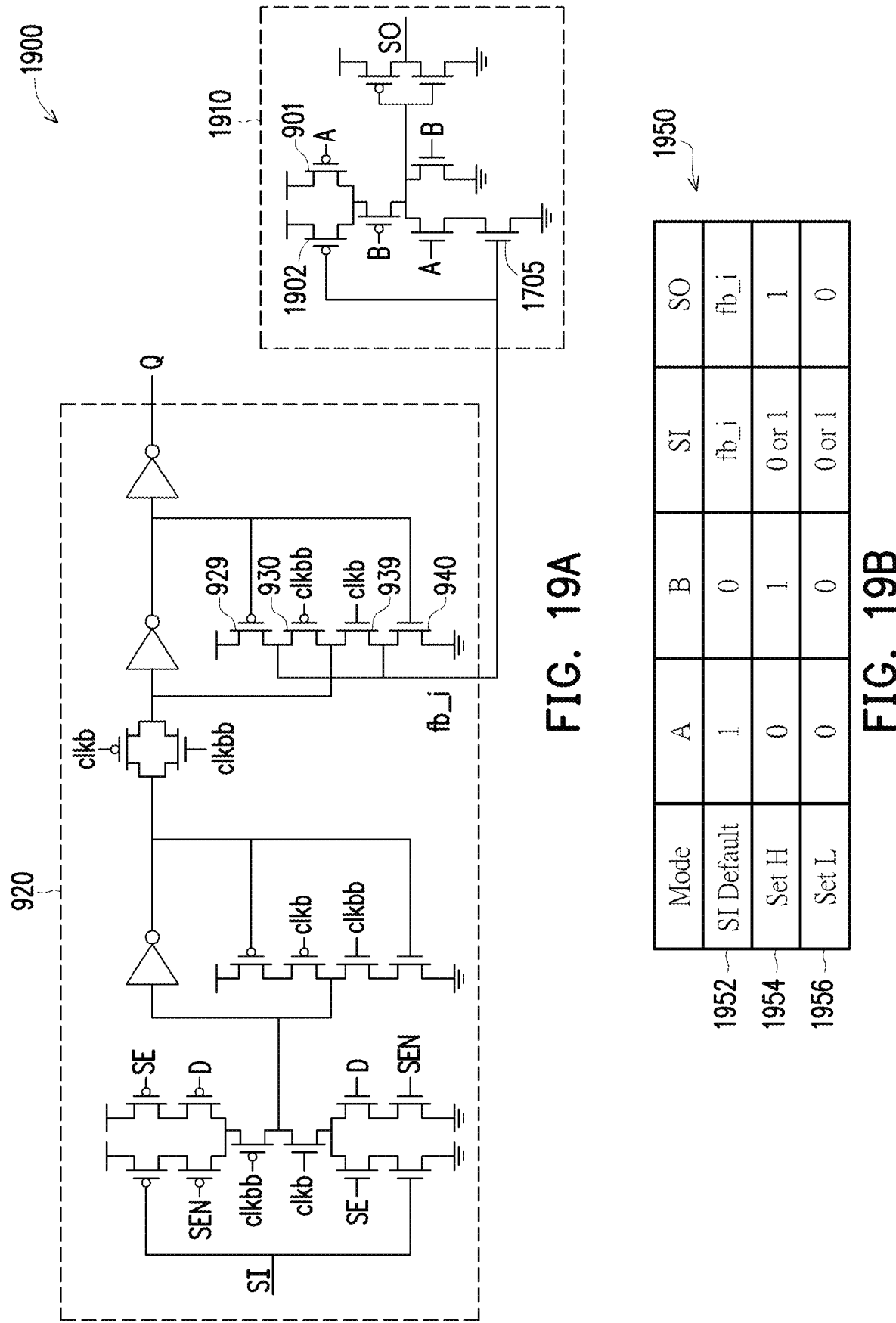
FIG. 19A is an electrical schematic illustrating another example pre-settable scan flip-flop circuit in accordance with various embodiments of the present disclosure.
FIG. 19B is a logic table illustrating various signals of pre-setting combinational logic circuit in accordance with various embodiments of the present disclosure.

FIG. 19A is an electrical schematic illustrating another example pre-settable scan flip-flop circuit 1900 in accordance with various embodiments of the present disclosure. Pre-settable scan flip-flop circuit 1900 includes a pre-setting combinational logic circuit 1910 electrically coupled to a scan flip-flop 920. Pre-setting combinational logic circuit 1910 is on the back end of the scan flip-flop 920 (e.g., pre-set arrangement 250).

Pre-setting combinational logic circuit 1910 has similar components, couplings, and operation similar to pre-setting combinational logic 910 except that the control signals of some transistors differ. For example, pre-setting combinational logic circuit 1910 is coupled to a common coupling point of source/drain terminals of PMOS transistors 929, 930 and a common coupling point of source/drain terminals of NMOS transistors 939, 940 of the scan flip-flop 920. The signal at this coupling point is a feedback internal (fb_i) signal and is coupled to the gate terminals of PMOS transistor 1902 and NMOS transistor 1905 (e.g., equivalent to PMOS transistor 902 and NMOS transistor 905, respectively). The operation of pre-setting combinational logic circuit 1910 is the same as described with respect to pre-setting combinational logic circuit 910 as described in detail in FIG. 9B, with the exception that the scan input (SI) signal is replaced with the feedback internal (fb_i) signal.

FIG. 19B is a logic table 1950 illustrating various signals of pre-setting combinational logic circuit 1910 in accordance with various embodiments of the present disclosure. Logic scenario includes default scenario 1952, set high scenario 1954, and set low scenario 1956. All of these scenarios are the same as previously described with respect to logic table 950, except that the default scenario 1952 outputs the feedback internal (fb_i) signal of scan flip-flop 920, rather than the scan input (SI) signal.

Figure 20:
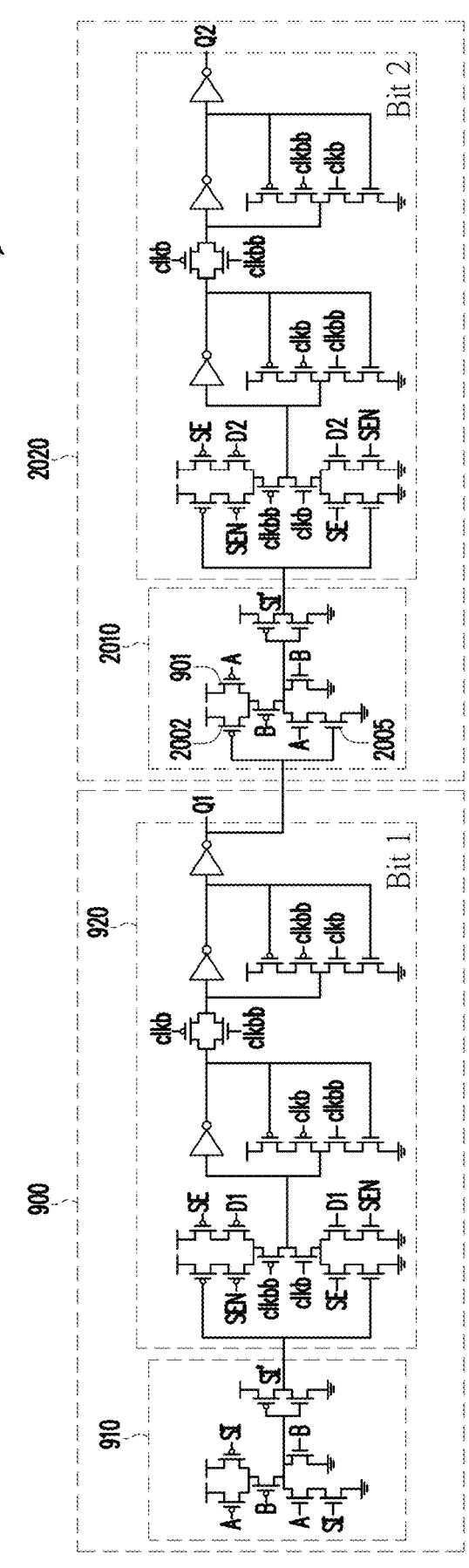
FIG. 20 is a block diagram illustrating a two multi-bit flop scan chain having all bits pre-settable in accordance with various embodiments of the present disclosure.

FIG. 20 is a block diagram illustrating a two multi-bit flop scan chain 2000 having all bits pre-settable in accordance with various embodiments of the present disclosure. The two multi-bit flop scan chain 2000 is an example of the N multi-bit flop scan chain 700 described in FIG. 7. Two multi-bit flop scan chain 2000 includes two pre-settable scan flip-flop circuits (e.g., pre-settable scan flip-flop circuit 900, 2020). Each pre-settable scan flip-flop circuit corresponds to a bit. For example, bit 1 has a pre-settable scan flip-flop circuit 900 as described in detail in FIGS. 9A-9B. Bit 2 has a pre-settable scan flip-flop circuit 2020 that is very similar to pre-settable scan flip-flop circuit 900 described in detail in FIGS. 9A-9B except that the output (Q1) signal of scan flip-flop 920 of bit 1 is coupled to the gate terminals of PMOS transistor 2002 (e.g., equivalent to PMOS transistor 902) and NMOS transistor 2005 (e.g., equivalent to NMOS transistor 905). The first bit (e.g., bit 1) pre-settable scan flip-flop circuit 900 is pre-settable as it receives its scan input (SI) signal from the pre-settable combinational logic circuit 910. The second bit (e.g., bit 2) pre-settable scan flip-flop circuit 2020 is pre-settable as it receives its input signal from the pre-settable combinational logic circuit 2010.

Figure 21:
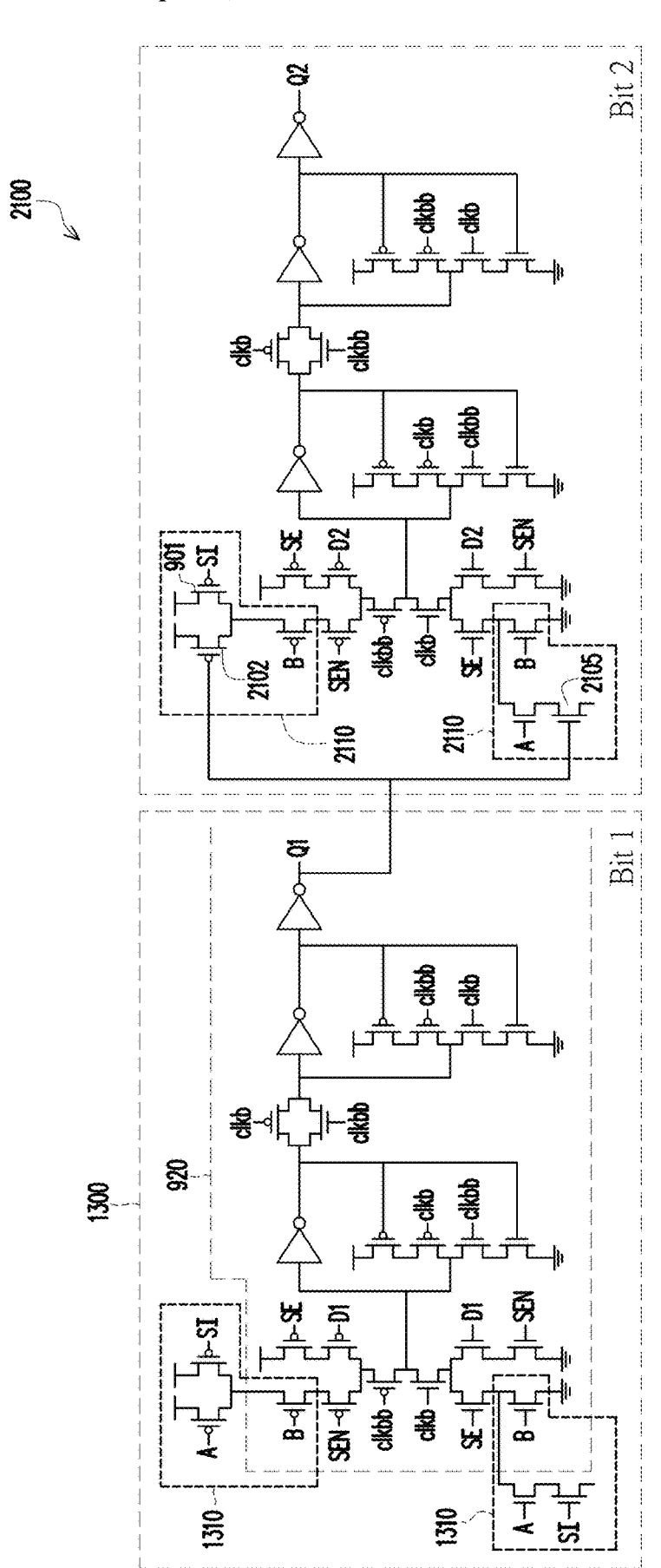
FIG. 21 is a block diagram illustrating another two multi-bit flop scan chain having all bits pre-settable in accordance with various embodiments of the present disclosure.

FIG. 21 is a block diagram illustrating another two multi-bit flop scan chain 2100 having all bits pre-settable in accordance with various embodiments of the present disclosure. The two multi-bit flop scan chain 2100 is another example of the N multi-bit flop scan chain 700 described in FIG. 7. Two multi-bit flop scan chain 2100 includes two pre-settable scan flip-flop circuits (e.g., pre-settable scan flip-flop circuit 1300, 2120). Each pre-settable scan flip-flop circuit corresponds to a bit. For example, bit 1 has a pre-settable scan flip-flop circuit 1300 as described in detail in FIG. 13. Bit 2 has a pre-settable scan flip-flop circuit 2120 that is very similar to pre-settable scan flip-flop circuit 1300 described in detail in FIG. 13 except that the output (Q1) signal of scan flip-flop 920 of bit 1 is coupled to the gate terminals of PMOS transistor 2102 (e.g., equivalent to PMOS transistor 902) and NMOS transistor 2105 (e.g., equivalent to NMOS transistor 905). The first bit (e.g., bit 1) pre-settable scan flip-flop circuit 1300 is pre-settable as it receives its scan input (SI) signal from the pre-settable combinational logic circuit 1310. The second bit (e.g., bit 2) pre-settable scan flip-flop circuit 2120 is pre-settable as it receives its input signal from the pre-settable combinational logic circuit 2110.

Figure 22:
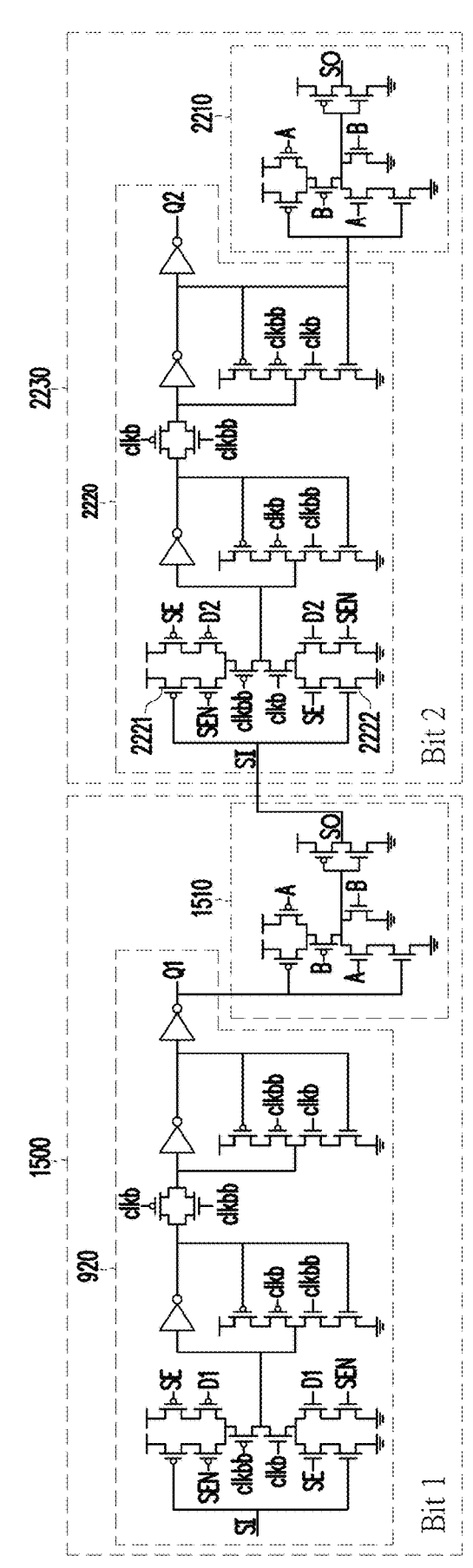
FIG. 22 is a block diagram illustrating another two multi-bit flop scan chain having all bits pre-settable in accordance with various embodiments of the present disclosure.

FIG. 22 is a block diagram illustrating another two multi-bit flop scan chain 2200 having all bits pre-settable in accordance with various embodiments of the present disclosure. The two multi-bit flop scan chain 2200 is an example of the N multi-bit flop scan chain 700 described in FIG. 7. Two multi-bit flop scan chain 2200 includes two pre-settable scan flip-flop circuits (e.g., pre-settable scan flip-flop circuit 1500, 2230). Each pre-settable scan flip-flop circuit corresponds to a bit. For example, bit 1 has a pre-settable scan flip-flop circuit 1500 as described in detail in FIGS. 15A-15B. Bit 2 has a pre-settable scan flip-flop circuit 2230 that is very similar to pre-settable scan flip-flop circuit 1500 described in detail in FIGS. 15A-15B except that the output (SO) signal of pre-setting combinational logic circuit 1510 of bit 1 is coupled to the gate terminals of PMOS transistor 2221 (e.g., equivalent to PMOS transistor 921) and NMOS transistor 2222 (e.g., equivalent to NMOS transistor 922) of scan flip-flop 2220 (e.g., equivalent to scan flip-flop 920). The first bit (e.g., bit 1) pre-settable scan flip-flop circuit 1500 is pre-settable on the backend as it modifies the output of scan flip-flop 920 using pre-settable combinational logic circuit 1510. The second bit (e.g., bit 2) pre-settable scan flip-flop circuit 2230 is pre-settable on the backend as it modifies the output of scan flip-flop 2220 using pre-settable combinational logic circuit 2210.

Figure 23:
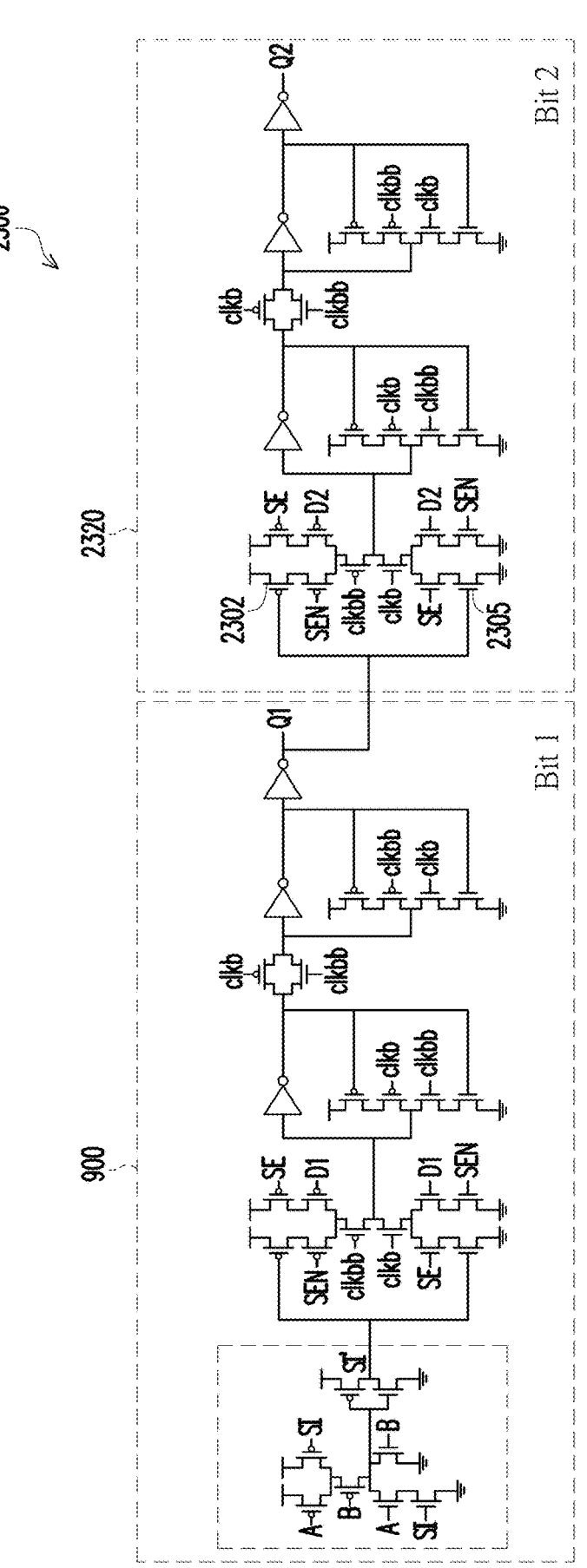
FIG. 23 is a block diagram illustrating another two multi-bit flop scan chain having a pre-settable first bit in accordance with various embodiments of the present disclosure.

FIG. 23 is a block diagram illustrating another two multi-bit flop scan chain 2300 having a pre-settable first bit in accordance with various embodiments of the present disclosure. The two multi-bit flop scan chain 2300 is an example of the N multi-bit flop scan chain 600 described in FIG. 6. Two multi-bit flop scan chain 2300 includes one pre-settable scan flip-flop circuit 900 corresponding to the first bit (e.g., bit 1). Bit 2 includes a scan flip-flop 2310 that is similar to scan flip-flop 920 described in FIG. 9 except that the gate terminals of PMOS transistor 2302 (e.g., equivalent to PMOS transistor 902) and NMOS transistor 2305 (e.g., equivalent to NMOS transistor 905) are coupled to the output (Q1) of pre-settable scan flip-flop circuit 900.

Figure 24:
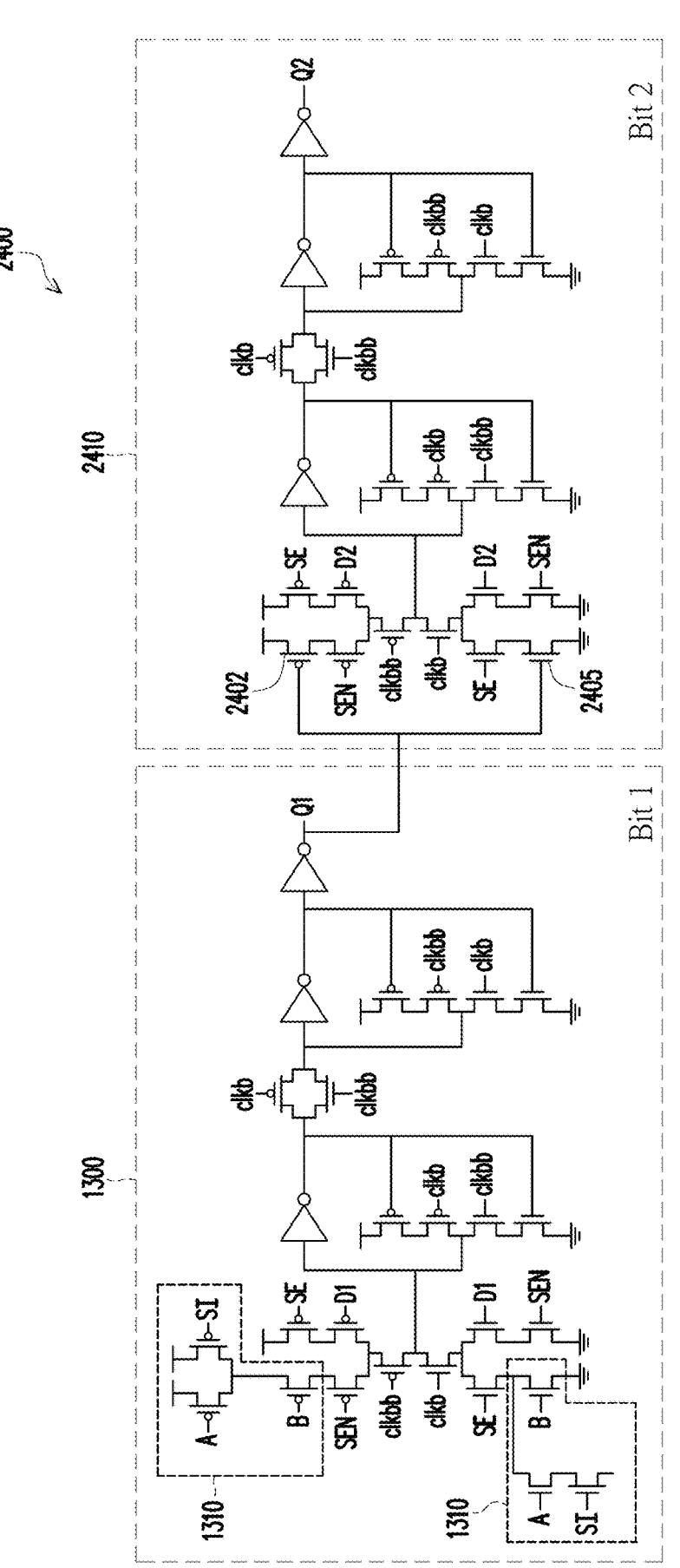
FIG. 24 is a block diagram illustrating another two multi-bit flop scan chain having a pre-settable first bit in accordance with various embodiments of the present disclosure.

FIG. 24 is a block diagram illustrating another two multi-bit flop scan chain 2400 having a pre-settable first bit in accordance with various embodiments of the present disclosure. The two multi-bit flop scan chain 2400 is an example of the N multi-bit flop scan chain 600 described in FIG. 6. Two multi-bit flop scan chain 2400 includes one pre-settable scan flip-flop circuit 1300 corresponding to the first bit (e.g., bit 1). Bit 2 includes a scan flip-flop 2410 that is similar to scan flip-flop 920 described in FIG. 9 except that the gate terminals of PMOS transistor 2402 (e.g., equivalent to PMOS transistor 902) and NMOS transistor 2405 (e.g., equivalent to NMOS transistor 905) are coupled to the output (Q1) of pre-settable scan flip-flop circuit 1300.

Figure 25:
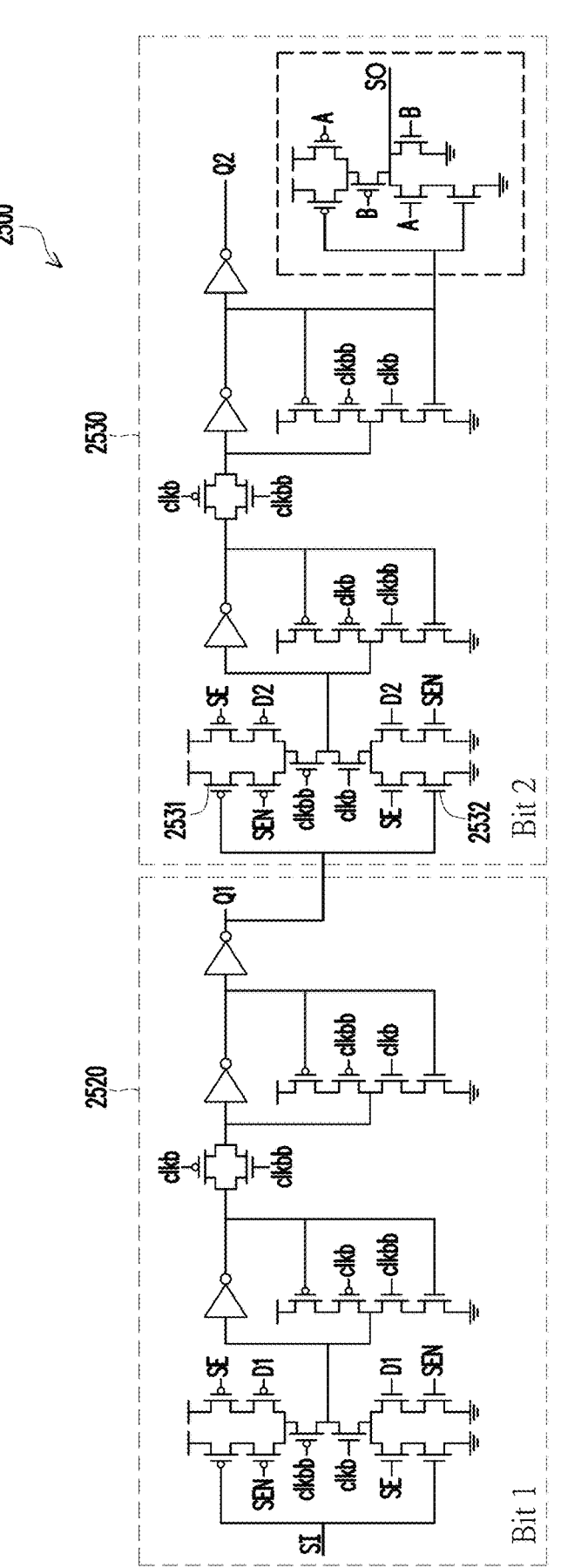
FIG. 25 is a block diagram illustrating another two multi-bit flop scan chain having a pre-settable last bit in accordance with various embodiments of the present disclosure.

FIG. 25 is a block diagram illustrating another two multi-bit flop scan chain 2500 having a pre-settable last bit in accordance with various embodiments of the present disclosure. The two multi-bit flop scan chain 2500 is an example of the N multi-bit flop scan chain 800 described in FIG. 8. Two multi-bit flop scan chain 2500 includes one pre-settable scan flip-flop circuit 2530 corresponding to the last bit (e.g., bit 2). Bit 1 includes a scan flip-flop 2520 that is similar to scan flip-flop 920 described in FIG. 9 except its input is the scan input (SI) signal. Bit 2 is a pre-settable scan flip-flop circuit 2530 similar to the pre-settable scan flip-flop circuit 1700 described in FIGS. 17A-17B except that the gate terminals of PMOS transistor 2531 (e.g., equivalent to PMOS transistor 921) and NMOS transistor 2532 (e.g., equivalent to NMOS transistor 922) are coupled to the output (Q1) signal of scan flip-flop 2520.

Figure 26:
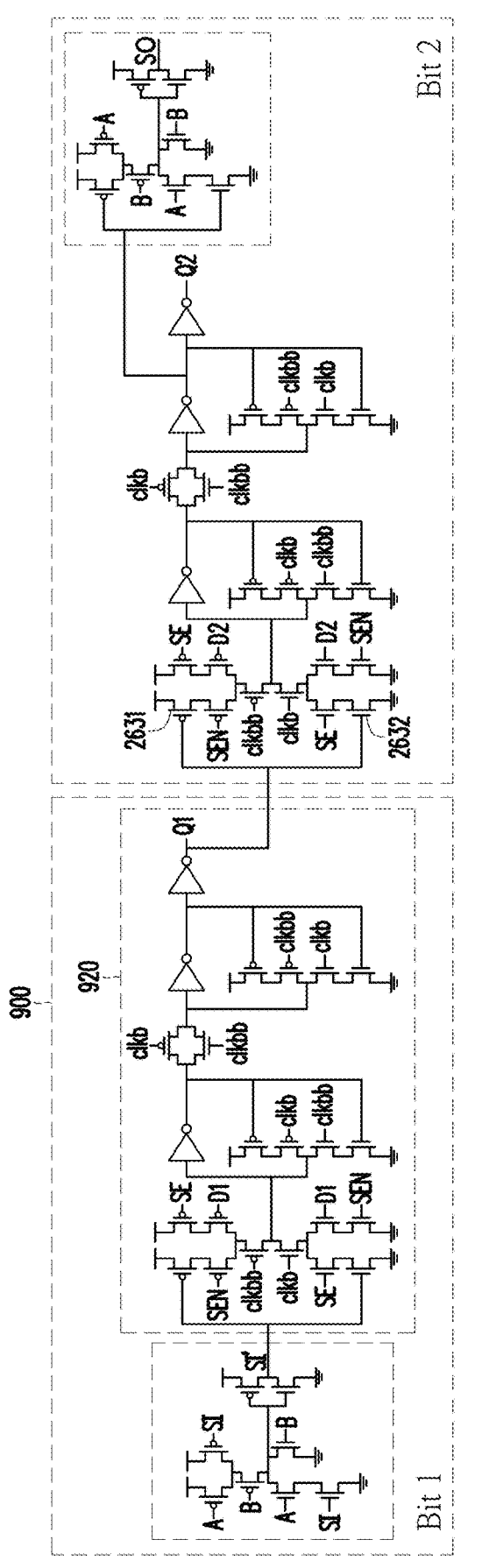
FIG. 26 is a block diagram illustrating another two multi-bit flop scan chain having a pre-settable first bit and a pre-settable last bit in accordance with various embodiments of the present disclosure.

FIG. 26 is a block diagram illustrating another two multi-bit flop scan chain 2600 having a pre-settable first bit and a pre-settable last bit in accordance with various embodiments of the present disclosure. The two multi-bit flop scan chain 2600 is an example of a combination of the N multi-bit flop scan chain 600 described in FIG. 6 and the N multi-bit flop scan chain 800 described in FIG. 8. Two multi-bit flop scan chain 2600 includes two pre-settable scan flip-flop circuits (e.g., pre-settable scan flip-flop circuit 900 and pre-settable scan flip-flop circuit 2630). Bit 2 is a pre-settable scan flip-flop circuit 2630 similar to the pre-settable scan flip-flop circuit 1700 described in FIGS. 17A-17B except that the gate terminals of PMOS transistor 2631 (e.g., equivalent to PMOS transistor 921) and NMOS transistor 2632 (e.g., equivalent to NMOS transistor 922) are coupled to the output (Q1) signal of scan flip-flop 920.

Figure 27:
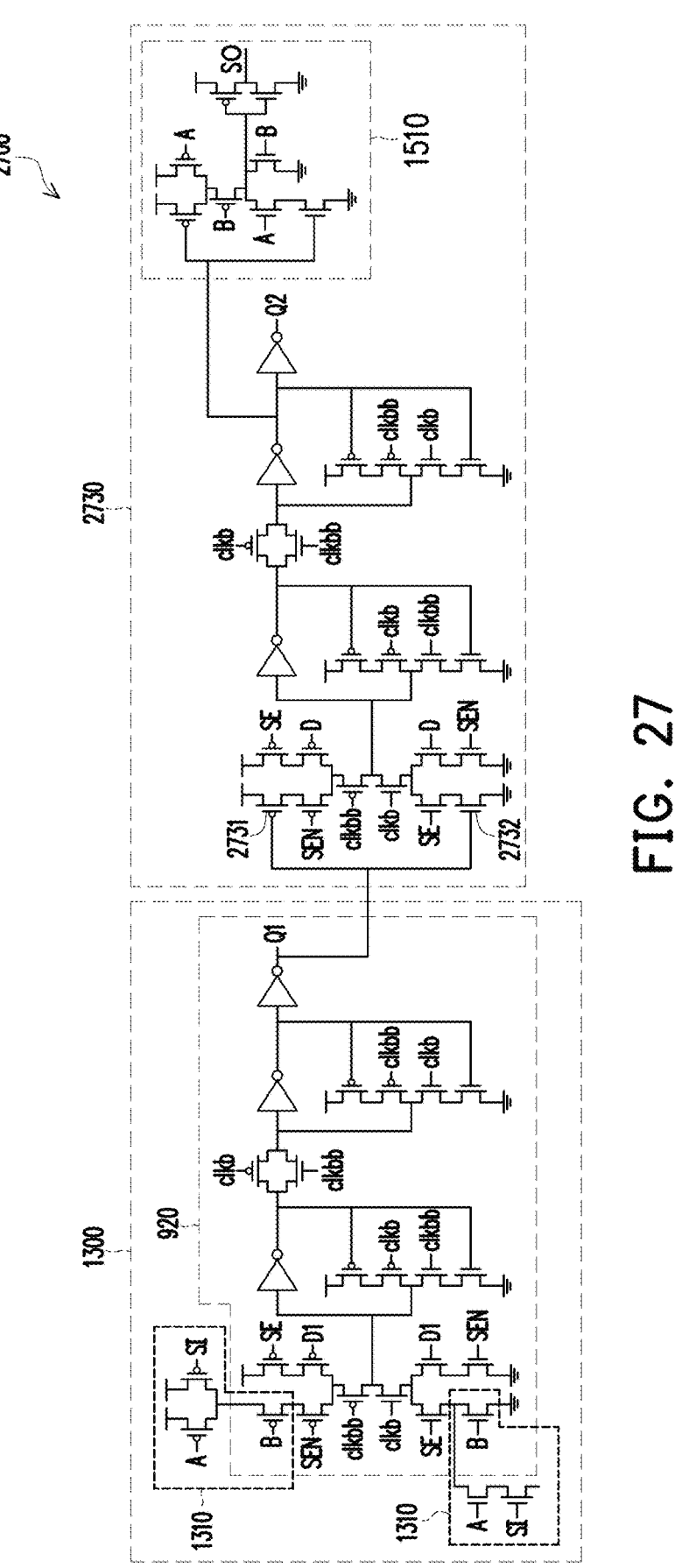
FIG. 27 is a block diagram illustrating another two multi-bit flop scan chain having a pre-settable first bit and a pre-settable last bit in accordance with various embodiments of the present disclosure.

FIG. 27 is a block diagram illustrating another two multi-bit flop scan chain 2700 having a pre-settable first bit and a pre-settable last bit in accordance with various embodiments of the present disclosure. The two multi-bit flop scan chain 2700 is another example of a combination of the N multi-bit flop scan chain 600 described in FIG. 6 and the N multi-bit flop scan chain 800 described in FIG. 8. Two multi-bit flop scan chain 2700 includes two pre-settable scan flip-flop circuits (e.g., pre-settable scan flip-flop circuit 1300 and pre-settable scan flip-flop circuit 2730). Bit 2 is a pre-settable scan flip-flop circuit 2730 similar to the pre-settable scan flip-flop circuit 1700 described in FIGS. 17A-17B except that the gate terminals of PMOS transistor 2731 (e.g., equivalent to PMOS transistor 921) and NMOS transistor 2732 (e.g., equivalent to NMOS transistor 922) are coupled to the output (Q1) signal of scan flip-flop 920.

While FIGS. 20-27 describe some example multi-bit flop scan chains having various pre-settable bits a person of ordinary skill in the art can appreciate that these are not exhaustive of the possible combinations. Any combination of pre-settable scan flip-flop circuits can be implemented in a multi-bit flop scan chain.

FIG. 28 is a process flow diagram 2800 illustrating method of generating a pre-defined input or output for a scan flip-flop chain in a pre-set operational mode accordance with various embodiments of the present disclosure. While FIG. 28 is described here with reference to previously described structures for ease in understanding, it is understood that the method applies to many other structures as well. A predefined input or output for a scan flip-flop chain is generated by receiving, at step 2810 by a plurality of transistors (e.g., transistors of scan flip-flop device such as scan flip-flop device 920) interconnected together, an input signal (e.g., scan input (SI) signal, inverted scan input (SIN), signal output from scan flip-flop device such as Q, QN) comprising a logic high or a logic low. The plurality of transistors are selectively operated, at step 2820, based on the logic high or the logic low. For example, a logic high signal operates NMOS transistors and a logic low signal operates PMOS transistors. An output signal is generated, at step 2830, based on captured data of the selectively operating plurality of transistors. For example, the output signal of scan flip-flop 920 is based on which transistors are operational and which are not operational. A pre-setting combinational logic circuit (e.g., pre-setting combinational logic circuits 210, 230, 520, 540, 640, 740, 750, 760, 850, 910, 1010, 1110, 1210, 1310, 1410, 1510, 1610, 1710, 1810, 1910, 2010, 2110, 2210) coupled to a subset of the plurality of transistors, overrides, at step 2840, either the input signal or the output signal to be set to a logic high or a logic low.

Use of the various systems, circuits, and methods as described herein can provide a number of advantages. For example, use of the various scan chains having pre-settable combinational logic circuits in various positions facilitates various control points for debugging of the scan flip-flop operation. The use of control signals (e.g., control signals A and B) facilitates the ability to pre-set individual scan flip-flops so as to assist in the identification of a failure.

In one embodiment, a system includes a plurality of flip-flop devices and a first pre-setting combinational logic circuit. The plurality of flip-flop devices coupled together in series. The plurality of flip-flop devices are configured to receive a scan input signal, capture data output from each flip-flop device of the plurality of flip-flop devices based on the scan input signal, and generate a scan output signal comprising the captured data. The first pre-setting combinational logic circuit is coupled to a first flip-flop device of the plurality of flip-flop devices. The first pre-setting combinational logic circuit includes a plurality of transistors and is configured to override and set either the scan input signal to the first flip-flop device or the scan output signal of the first flip-flop device based on selective operation of the plurality of transistors.

In another embodiment, a scan flip-flop device includes a plurality of transistors, a plurality of inverters, and a pre-setting combinational logic circuit. The plurality of transistors and the plurality of inverters are interconnected together and are configured to receive a scan input signal, capture data output from each flip-flop device of the plurality of flip-flop devices based on the scan input signal, and generate a scan output signal comprising the captured data. The pre-setting combinational logic circuit is coupled to a subset of the plurality of transistors or one of the plurality of inverters. The pre-setting combinational logic circuit is also configured to override and pre-set either the scan input signal or the scan output signal.

In yet another embodiment, a method includes receiving, by a plurality of transistors interconnected together, an input signal comprising a logic high or a logic low. The plurality of transistors are selectively operated based on the logic high or the logic low. An output signal is generated based on captured data of the selectively operating plurality of transistors. A pre-setting combinational logic circuit coupled to a subset of the plurality of transistors overrides either the input signal or the output signal to be set to a logic high or a logic low.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
   a first pre-setting combinational logic circuit coupled to a first device, the first pre-setting combinational logic circuit configured to override and set either a scan input signal to the first device or a scan output signal of the first device based on selective operation of a plurality of transistors.

2. The system of claim 1, wherein the first pre-setting combinational logic circuit is configured to override and set the scan input signal when the first pre-setting combinational logic circuit is coupled on a frontend of the first device and the first pre-setting combinational logic circuit is configured to override and set the scan output signal when the first pre-setting combinational logic circuit is coupled on a backend of the first device.

3. The system of claim 1, wherein the plurality of transistors comprises a first set of transistors and a second set of transistors, wherein the first set of transistors and the second set of transistors are coupled together at a common coupling point, and the first pre-setting combinational logic circuit further comprises an inverter coupled to the common coupling point via an input terminal of the inverter, an output of the inverter provides either the scan output signal or the scan input signal.

4. The system of claim 1, wherein the plurality of transistors comprises a first set of transistors and a second set of transistors, and wherein the first set of transistors differs in type from the second set of transistors and wherein each of the first set of transistors receives a first control signal, a second control signal, and an input signal and each of the second set of transistors receives the first control signal, the second control signal, and the input signal.

5. The system of claim 4, wherein the first control signal, the second control signal, and the input signal selectively operate the first set of transistors and the second set of transistors in order to override and set either the scan input signal to the first device or the scan output signal of the first device.

6. The system of claim 1, wherein the plurality of transistors comprises a first set of transistors and a second set of transistors, and wherein at least one transistor of the first set of transistors and at least one transistor of the second set of transistors are shared with two individual transistors of the first device.

7. The system of claim 1, wherein the first pre-setting combinational logic circuit is coupled to a backend of the first device via an internal signal of the first pre-setting combinational logic circuit.

8. The system of claim 1, wherein the first pre-setting combinational logic circuit is coupled to a backend of the first device via an output signal of the first device.

9. The system of claim 1, wherein the first pre-setting combinational logic circuit is coupled to a frontend of the first device via an output signal of the first pre-setting combinational logic circuit.

10. The system of claim 1, further comprising:

a plurality of devices including the first device; and a second pre-setting combinational logic circuit coupled to a second device of the plurality of devices on either a frontend of the second device or a backend of the second device, the second pre-setting combinational logic circuit configured to override and set either an input signal to the second device or an output signal of the second device based on selective operation of transistors within the second pre-setting combinational logic circuit.

11. A scan flip-flop device comprising:

a pre-setting combinational logic circuit coupled to a subset of a plurality of transistors or a first inverter, wherein the pre-setting combinational logic circuit is configured to override and pre-set either a scan input signal received by the plurality of transistors or the first inverter or a scan output signal generated by the plurality of transistors or the first inverter.

12. The scan flip-flop device of claim 11, wherein the pre-setting combinational logic circuit is configured to override and set the scan input signal when the pre-setting combinational logic circuit is coupled on a frontend of the plurality of transistors and the pre-setting combinational logic circuit is configured to override and set the scan output signal when the pre-setting combinational logic circuit is coupled on a backend of the plurality of transistors.

13. The scan flip-flop device of claim 11, wherein the pre-setting combinational logic circuit comprises a first set of transistors and a second set of transistors that are coupled together at a common coupling point, and the pre-setting combinational logic circuit further comprises a second inverter coupled to the common coupling point via an input terminal of the second inverter, the output of the second inverter providing either the scan output signal or the scan input signal.

14. The scan flip-flop device of claim 13, wherein the first set of transistors differs in type from the second set of transistors and wherein each of the first set of transistors receives a first control signal, a second control signal, and an input signal and each of the second set of transistors receives the first control signal, the second control signal, and the input signal.

15. The scan flip-flop device of claim 14, wherein the first control signal, the second control signal, and the input signal selectively operate the first set of transistors and the second set of transistors in order to override and set either the scan input signal to the plurality of transistors or the scan output signal of the plurality of transistors.

16. The scan flip-flop device of claim 13, wherein at least one transistor of the first set of transistors and at least one transistor of the second set of transistors are shared with two individual transistors of the subset of the plurality of transistors.

17. The scan flip-flop device of claim 11, wherein the pre-setting combinational logic circuit is coupled to a backend of the plurality of transistors via an internal signal of the pre-setting combinational logic circuit.

18. The scan flip-flop device of claim 11, wherein the pre-setting combinational logic circuit is coupled to a backend of the plurality of transistors via an output signal of the plurality of transistors.

19. The scan flip-flop device of claim 11, wherein the pre-setting combinational logic circuit is coupled to a frontend of the plurality of transistors via an output signal of the pre-setting combinational logic circuit.

20. A method for generating a pre-defined input or output, the method comprising:

selectively operating a plurality of transistors based on an input signal;

generating an output signal based on the selectively operating of the plurality of transistors; and overriding, by a pre-setting combinational logic circuit coupled to a subset of the plurality of transistors, either the input signal or the output signal to be set to a logic high or a logic low.

* * * * *